United States Patent
Matsubara et al.

(10) Patent No.: US 9,692,211 B2
(45) Date of Patent: Jun. 27, 2017

(54) VERTICAL CAVITY SURFACE EMITTING LASER ARRAY

(71) Applicant: MURATA MANUFACTURING CO., LTD., Kyoto-fu (JP)

(72) Inventors: Ippei Matsubara, Nagaokakyo (JP); Takayuki Kona, Nagaokakyo (JP); Keiji Iwata, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/002,682

(22) Filed: Jan. 21, 2016

(65) Prior Publication Data

US 2016/0141839 A1    May 19, 2016

Related U.S. Application Data

(63) Continuation of application No. PCT/JP2014/063952, filed on May 27, 2014.

(30) Foreign Application Priority Data

Jul. 22, 2013    (JP) .................................. 2013-151608

(51) Int. Cl.
     *H01S 5/42*          (2006.01)
     *H01S 5/042*        (2006.01)
     (Continued)

(52) U.S. Cl.
     CPC ............ *H01S 5/423* (2013.01); *H01S 5/0042* (2013.01); *H01S 5/02276* (2013.01);
     (Continued)

(58) Field of Classification Search
     CPC .......... H01S 5/423; H01S 5/183; H01S 5/343; H01S 5/42; H01S 5/02276; H01S 5/0042; H01S 5/4018; H01S 5/042
     See application file for complete search history.

(56) References Cited

U.S. PATENT DOCUMENTS

2014/0218898 A1*   8/2014   Seurin ................. H01S 5/02276
                                                                 362/157

FOREIGN PATENT DOCUMENTS

JP        63-306687 A     12/1988
JP        03-034555 A      2/1991
                (Continued)

OTHER PUBLICATIONS

International Search Report—PCT/JP2014/063952 mailed Aug. 26, 2014.

(Continued)

*Primary Examiner* — Dung Nguyen
(74) *Attorney, Agent, or Firm* — Studebaker & Brackett PC

(57) ABSTRACT

A VCSEL array includes a base substrate, VCSEL element columns arranged in a row direction (y direction) on a front-surface side of the base substrate and parallel wiring lines that connect the VCSEL element columns in parallel with each other. Each of the VCSEL element columns includes a plurality of VCSEL elements arranged in a column direction (x direction) and a plurality of series wiring lines. The plurality of series wiring lines serially connect every two VCSEL elements that are adjacent to each other in the column direction among the plurality of VCSEL elements in such an orientation that the forward directions of the two VCSEL elements match. Insulating grooves are formed on the base substrate. The insulating grooves electrically insulate the VCSEL element columns from each other. The insulating grooves electrically insulate the VCSEL elements from each other.

10 Claims, 22 Drawing Sheets

(51) Int. Cl.
*H01S 5/00* (2006.01)
*H01S 5/022* (2006.01)
*H01S 5/40* (2006.01)
H01S 5/183 (2006.01)

(52) U.S. Cl.
CPC ............ *H01S 5/042* (2013.01); *H01S 5/4018* (2013.01); *H01L 2224/24* (2013.01); *H01S 5/18311* (2013.01); *H01S 2301/176* (2013.01)

(56) References Cited

FOREIGN PATENT DOCUMENTS

| | | |
|---|---|---|
| JP | 08-031889 A | 2/1995 |
| JP | 2000-101136 A | 4/2000 |
| JP | 2006-066845 A | 3/2006 |
| JP | 2008-508730 A | 3/2008 |
| JP | 2009094308 A * | 4/2009 |
| JP | 2009-260311 A | 11/2009 |
| JP | 2011-181925 A | 9/2011 |
| JP | 2011-228553 A | 11/2011 |
| WO | 2010/084890 A1 | 7/2010 |

OTHER PUBLICATIONS

Written Opinion—PCT/JP2014/063952 mailed Aug. 26, 2014.
International Preliminary Report on Patentability of the International Searching Authority; PCT/JP2014/063952 issued on Jan. 26, 2016.

* cited by examiner

VERTICAL CAVITY SURFACE EMITTING LASER ARRAY

CROSS REFERENCE TO RELATED APPLICATIONS

This application claims benefit of priority to Japanese Patent Application 2013-151608 filed Jul. 22, 2013, and to International Patent Application No. PCT/JP2014/063952 filed May 27, 2014, the entire content of which is incorporated herein by reference.

TECHNICAL FIELD

The present disclosure relates to a vertical cavity surface emitting laser array.

BACKGROUND

Generally, in the process of manufacturing a semiconductor element, an acceleration test is performed in which a temperature or voltage load is applied, that is, a burn-in test is performed. As a result of the burn-in test, when the value of a characteristic of a certain semiconductor element fails to satisfy a prescribed reference value, that semiconductor element is removed from a group of non-defective components as an initial-stage defective component.

In a vertical cavity surface emitting laser element, light is emitted in a direction orthogonal to a semiconductor substrate. Consequently, a burn-in test can be performed in a wafer state where a plurality of vertical cavity surface emitting laser elements are formed in an array pattern. This type of burn-in test is called wafer level burn-in (WLBI).

There is a demand for techniques for performing WLBI on a vertical cavity surface emitting laser array with accuracy and at low cost. In a surface emission wafer disclosed in Japanese Unexamined Patent Application Publication No. 2006-66845 for example, a plurality of surface emission elements are connected in series in such an orientation that the forward directions of light-emitting element units match.

SUMMARY

Technical Problem

In order to accurately carry out a burn-in test, it is necessary that load conditions be the same for all the vertical cavity surface emitting laser elements within a wafer. The value of a load current is one of the most important parameters in the burn-in test of vertical cavity surface emitting laser elements. Therefore, it is demanded that the values of the load currents of the vertical cavity surface emitting laser elements be made the same as one another.

However, there is a conductive semiconductor layer inside a semiconductor substrate in the surface emission wafer disclosed in Japanese Unexamined Patent Application Publication No. 2006-66845. Consequently, when a load current flows between serially connected surface emission elements, there is a possibility that part of the load current will leak out through the inside of the conductive semiconductor layer. As a result, it may not be possible to make the load currents of serially connected surface emission elements be the same as one another.

An object of the present disclosure is to provide a vertical cavity surface emitting laser array configured so that a burn-in test can be performed with accuracy and at low cost.

Solution to Problem

A vertical cavity surface emitting laser array according to a certain aspect of the present disclosure includes a semiconductor substrate, a plurality of vertical cavity surface emitting laser element columns and parallel wiring lines. The plurality of vertical cavity surface emitting laser element columns are arranged in a row direction on a front-surface side of the semiconductor substrate. The parallel wiring lines connect the plurality of vertical cavity surface emitting laser element columns in parallel with each other. The plurality of vertical cavity surface emitting laser element columns each include a plurality of vertical cavity surface emitting laser elements arranged in a column direction and a plurality of series wiring lines. The plurality of series wiring lines serially connect every two of the vertical cavity surface emitting laser elements that are adjacent to each other in the column direction among the plurality of vertical cavity surface emitting laser elements in such an orientation that forward directions of the two vertical cavity surface emitting laser elements match. A first insulating region that electrically insulates the plurality of vertical cavity surface emitting laser element columns from each other and a second insulating region that electrically insulates the plurality of vertical cavity surface emitting laser elements from each other are formed in the semiconductor substrate.

It is preferable that the vertical cavity surface emitting laser array further include at least one pair of dummy pads. The at least one pair of dummy pads are electrically connected to the parallel wiring lines in order to supply a load current from burn-in test probes to the plurality of vertical cavity surface emitting laser element columns.

It is preferable that the plurality of vertical cavity surface emitting laser elements be arranged inside a quadrangular region on the front-surface side of the semiconductor substrate. The pair of dummy pads are arranged near a first corner and a second corner positioned on a diagonal line among first to fourth corners corresponding to the four corners of the quadrangular region.

It is preferable that the parallel wiring lines each include a plurality of wiring line portions. The plurality of wiring line portions each connect in parallel two vertical cavity surface emitting laser element columns that are adjacent to each other in the row direction. A resistance value of each of the plurality of wiring line portions is set so as to be inversely proportional to a value of the load current that will flow through the wiring line portion in a state where the load current is supplied to the plurality of vertical cavity surface emitting laser element columns.

It is preferable that each of the plurality of wiring line portions be configured so as to have a wiring line width that corresponds to a value of the load current that will flow through the wiring line portion in a state where the load current is supplied to the plurality of vertical cavity surface emitting laser element columns.

It is preferable that the plurality of vertical cavity surface emitting laser element columns includes a first vertical cavity surface emitting laser element column including m (m is natural number of 2 or more) vertical cavity surface emitting laser elements and a second vertical cavity surface emitting laser element column including n (n is a natural number that is smaller than m) vertical cavity surface emitting laser elements. At least one of the pair of dummy pads is arranged in a region corresponding to the area of (m−n) vertical cavity surface emitting laser elements in the vicinity of the second vertical cavity surface emitting laser element column on the front-surface side of the semiconductor substrate.

It is preferable that the second vertical cavity surface emitting laser element column further include a dummy element. The dummy element causes a voltage drop to be generated that corresponds to the size of a voltage drop that would be caused by the (m–n) vertical cavity surface emitting laser elements.

It is preferable that the plurality of vertical cavity surface emitting laser elements each have an anode electrode, a cathode electrode, an anode electrode pad electrically connected to the anode electrode and a cathode electrode pad electrically connected to the cathode electrode. The parallel wiring lines each include a plurality of wiring line portions. The plurality of wiring line portions each connect in parallel two vertical cavity surface emitting laser element columns that are adjacent to each other in the row direction. The plurality of wiring line portions are each arranged between one cathode electrode pad and another cathode electrode pad of two vertical cavity surface emitting laser elements that are adjacent to each other in the row direction.

It is preferable that the semiconductor substrate have a semi-insulating property. The first and second insulating regions are each an insulating groove. The insulating grooves each have a shape that is recessed from the front-surface-side of the semiconductor substrate toward the inside of the semiconductor substrate. The parallel wiring lines each include a wiring line portion formed on the insulating groove of the second insulating region.

It is preferable that the semiconductor substrate have a semi-insulating property. The first and second insulating regions are each a high-resistance region that has a higher electrical resistivity than the semiconductor substrate.

Advantageous Effects of Disclosure

According to the present disclosure, a vertical cavity surface emitting laser array can be provided that is configured so that a burn-in test can be performed with accuracy and at low cost.

DETAILED DESCRIPTION

Figure 1A:
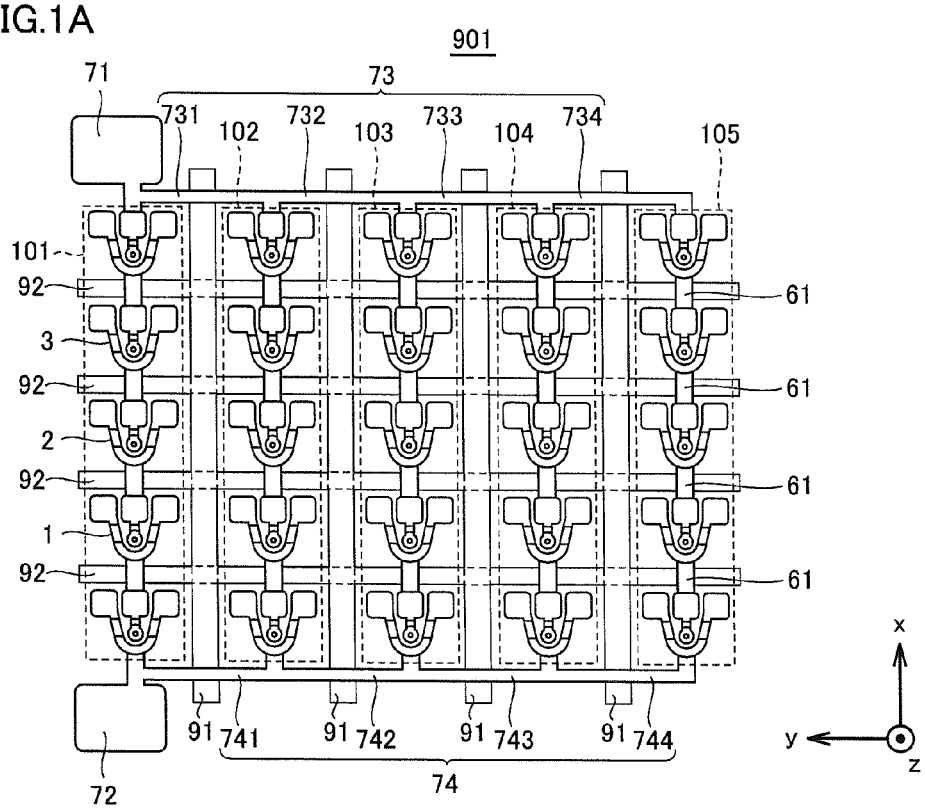
FIG. 1A is a plan view of a vertical cavity surface emitting laser array according to a first embodiment of the present disclosure.

Hereafter, embodiments of the present disclosure will be described in detail while referring to the drawings. In the figures, the same symbols denote identical or corresponding portions and repeated description thereof is omitted. In addition, the sizes of parts illustrated in the drawings are schematically represented and the sizes of the parts are not limited to the sizes illustrated in the drawings.

Figure 1B:
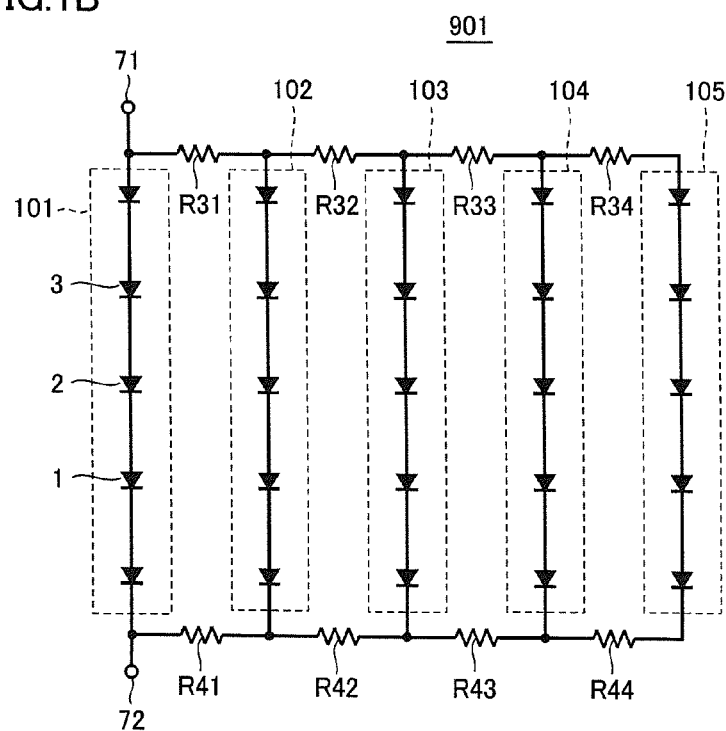
FIG. 1B is an equivalent circuit diagram of the vertical cavity surface emitting laser array according to the first embodiment of the present disclosure.

First Embodiment FIG. 1A is a plan view of a vertical cavity surface emitting laser (VCSEL) array according to a first embodiment of the present disclosure. FIG. 1B is an equivalent circuit diagram of the VCSEL array according to the first embodiment of the present disclosure.

Referring to FIGS. 1A and 1B, a VCSEL array 901 includes VCSEL element columns 101 to 105 arranged in a row direction (y direction), parallel wiring lines 73 and 74, a pair of dummy pads 71 and 72 and insulating grooves 91 and 92. Each of the VCSEL element columns 101 to 105 includes five VCSEL elements arranged in a column direction (x direction) and series wiring lines 61.

The parallel wiring lines 73 and 74 are for connecting in parallel every two VCSEL element columns that are adjacent to each other in the row direction (y direction) among the VCSEL element columns 101 to 105. The series wiring lines 61 electrically connect every two VCSEL elements that are adjacent to each other in the column direction in such an orientation that the forward directions of the elements match.

The dummy pads 71 and 72 are respectively electrically connected to the parallel wiring lines 73 and 74. The pair of dummy pads 71 and 72 are formed in order to supply a load current I (refer to FIG. 5 for all) from probes 63 to the VCSEL element columns 101 to 105. The load current I flows in a direction from the dummy pad 71 to the dummy pad 72.

The parallel wiring line 73 includes wiring line portions 731 to 734. The parallel wiring line 74 includes wiring line portions 741 to 744. The wiring line portions 731 and 741 connect the VCSEL element columns 101 and 102 in parallel with each other. The wiring line portions 732 and 742 connect the VCSEL element columns 102 and 103 in parallel with each other. The wiring line portions 733 and 743 connect the VCSEL element columns 103 and 104 in parallel with each other. The wiring line portions 734 and 744 connect the VCSEL element columns 104 and 105 in parallel with each other.

Resistances R31 to R34 and R41 to R44 are resistance components of the wiring line portions 731 to 734 and 741 to 744, respectively. In this embodiment, the resistance values of the resistances R31 to R34 and R41 to R44 are the same as one another.

The insulating grooves 91 electrically insulate the VCSEL element columns 101 to 105 from one another in a state where the parallel wiring lines 73 and 74 are not formed. The insulating grooves 92 electrically insulate the VCSEL elements from one another in a state where the series wiring lines 61 are not formed.

Since the structures of the individual VCSEL element columns are the same and the structures of the individual VCSEL elements are the same, hereafter, the structure of the VCSEL element column 101 and a VCSEL element 2 will be described as representative examples.

Figure 2:
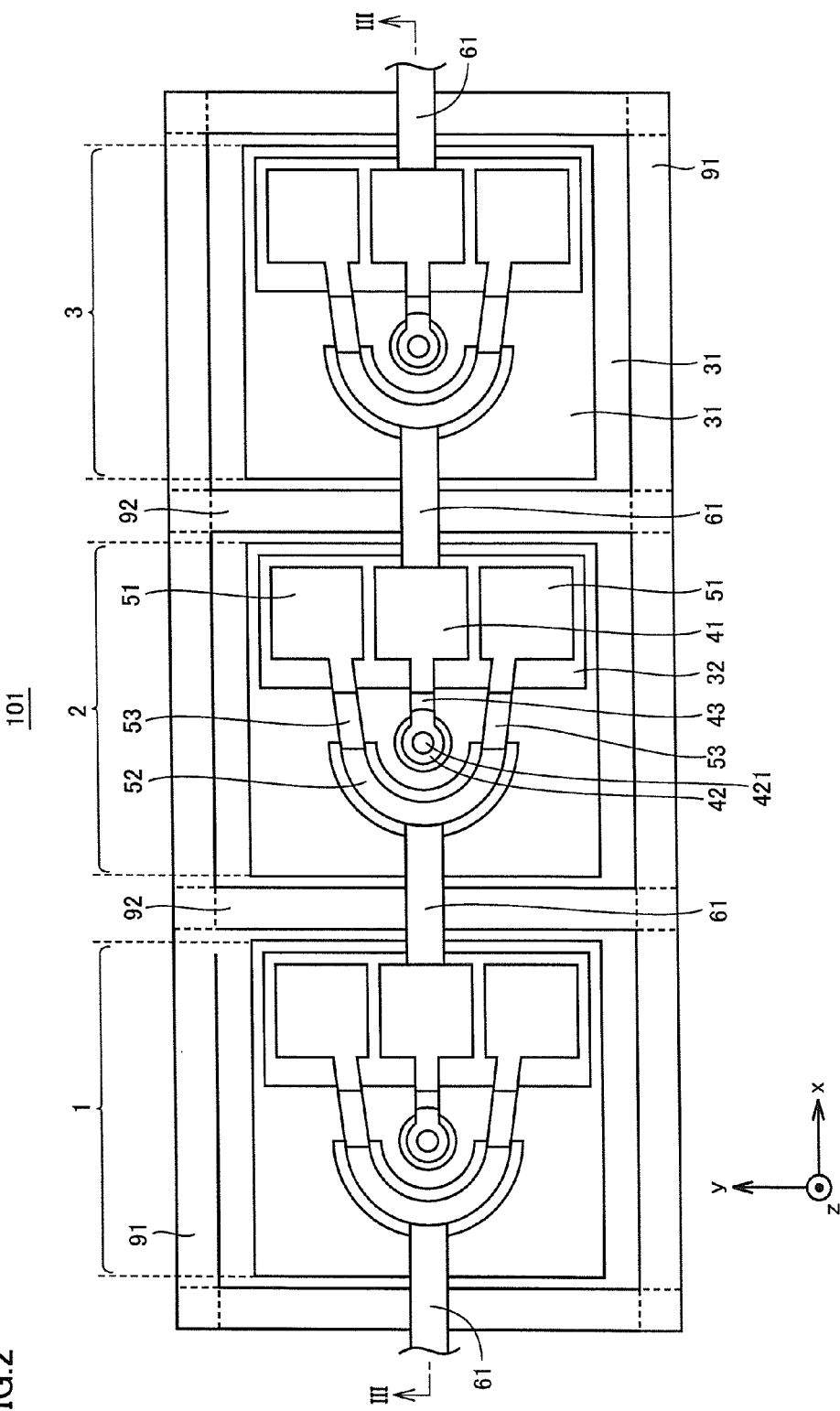
FIG. 2 is an enlarged view of part of a column of vertical cavity surface emitting laser elements illustrated in FIG. 1A.
Figure 3:
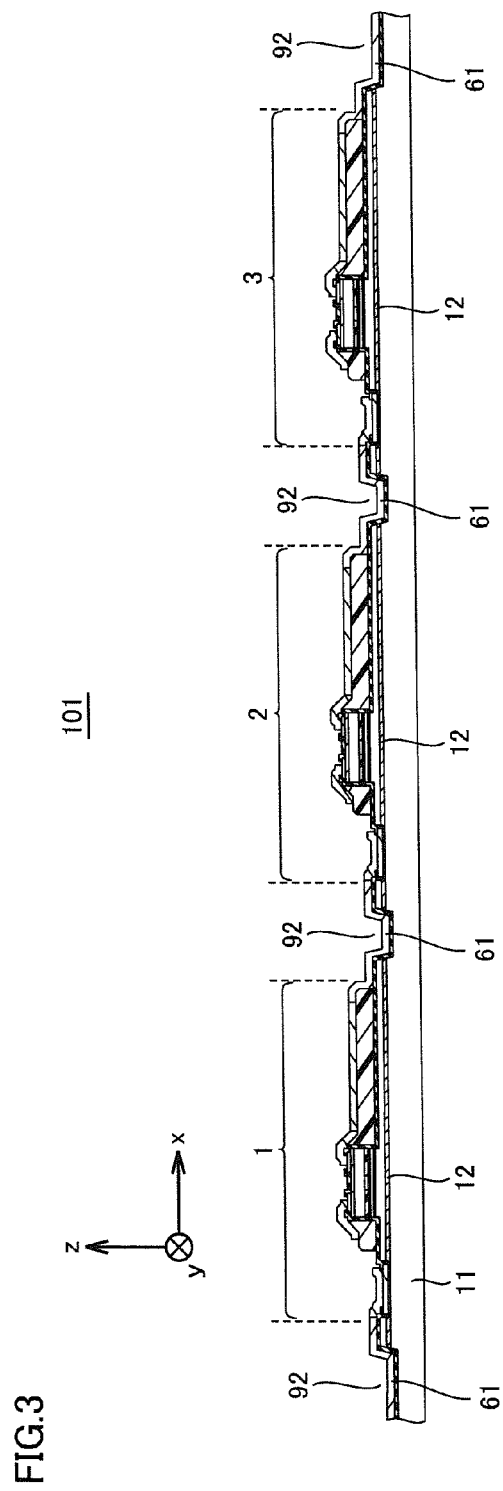
FIG. 3 is a sectional view of the column of vertical cavity surface emitting laser elements taken along a line III-III in FIG. 2.
Figure 4:
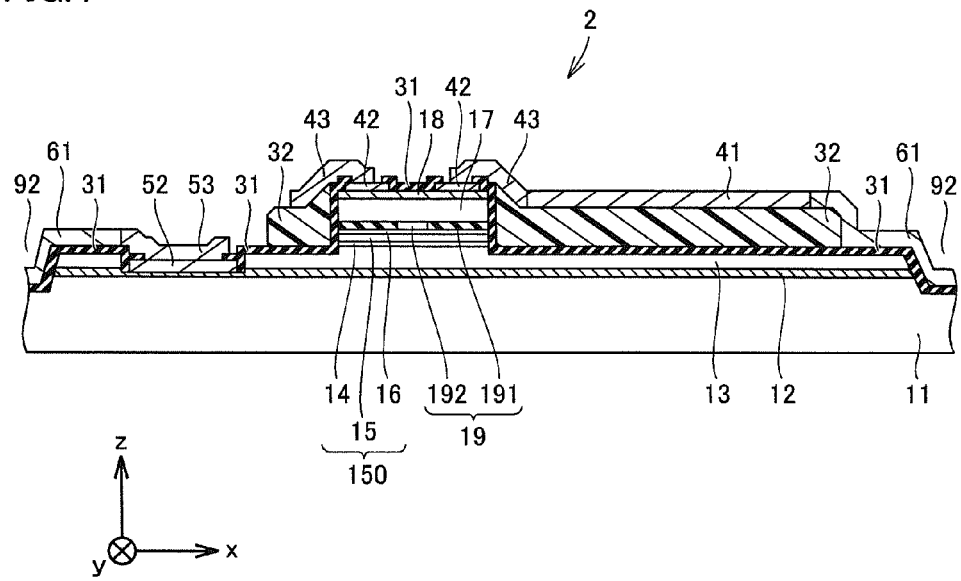
FIG. 4 is an enlarged view of a cross section of a vertical cavity surface emitting laser element illustrated in FIG. 3.

FIG. 2 is an enlarged view of part of the VCSEL element column 101 illustrated in FIG. 1A. FIG. 3 is a sectional view of the VCSEL element column 101 taken along line III-III in FIG. 2. FIG. 4 is an enlarged view of the cross section of the VCSEL element 2 illustrated in FIG. 3.

The VCSEL element 2 includes a base substrate 11, an n-type semiconductor contact layer (n-type contact layer) 12, an n-type semiconductor multilayer-film reflecting layer (n-type distributed Bragg reflector (DBR) layer) 13, an n-type semiconductor cladding layer (n-type cladding layer) 14, an active layer 15, a p-type semiconductor cladding layer (p-type cladding layer) 16, a p-type semiconductor multilayer-film reflecting layer (p-type DBR layer) 17, a p-type semiconductor contact layer (p-type contact layer) 18, a current constriction layer 19, an anode electrode pad 41, an anode ohmic electrode 42, an anode routing wiring line 43, cathode electrode pads 51, a cathode ohmic electrode 52 and cathode routing wiring lines 53.

The insulating groove 91 is formed between the VCSEL element column 101 and the VCSEL element column 102 (refer to FIG. 1A). The insulating grooves 92 are formed between the VCSEL elements 1 to 3. A direction from the rear surface side toward the front surface side of the base substrate 11 is represented by a z direction and a positive z direction is upward.

The material of the base substrate 11 is an n-type compound semiconductor that exhibits a semi-insulating property for example. An n-type gallium arsenide (GaAs) substrate having an electrical resistivity of $1.0 \times 10^7$ $\Omega \cdot$cm or more is used as the base substrate 11 for example. The base substrate 11 corresponds to a "semiconductor substrate" in the present disclosure.

The n-type contact layer 12 is formed on the base substrate 11. The material of the n-type contact layer 12 is a compound semiconductor that exhibits n-type conductivity. The n-type contact layer 12 is formed in order to realize with certainty ohmic contact between the n-type DBR layer 13 and the cathode ohmic electrode 52.

The n-type DBR layer 13 is formed on the n-type contact layer 12. The material of the n-type DBR layer 13 is a compound semiconductor that exhibits n-type conductivity and is aluminum gallium arsenide, for example. As an impurity for obtaining n-type conductivity, around $2 \times 10^{18}$ cm$^{-3}$ of silicon (Si) is introduced for example.

In the n-type DBR layer 13, a high-refractive-index layer and a low-refractive-index layer (neither is illustrated) are alternately stacked. The thickness of each layer is $\lambda/4$ ($\lambda$: wavelength inside medium). The high-refractive-index layers and the low-refractive-index layers have different composition ratios of Al to Ga. The compositions of the high-refractive-index layers and the low-refractive-index layers are for example respectively expressed as n–$Al_{0.9}Ga_{0.1}As$ and n–$Al_{0.12}Ga_{0.88}As$. One high-refractive-index layer and one low-refractive-index layer form a pair and for example 30 to 40 pairs of these layers are formed.

The n-type cladding layer 14 is formed on the n-type DBR layer 13. The material of the n-type cladding layer 14 is a compound semiconductor that exhibits n-type conductivity.

The active layer 15 is formed on the n-type cladding layer 14. The active layer 15 is a non-doped region into which an impurity has not been introduced. As one example, the active layer 15 has a multi quantum well (MQW) structure in which a quantum well layer and a barrier layer (neither is illustrated) are alternately stacked.

The p-type cladding layer 16 is formed on the active layer 15. The material of the p-type cladding layer 16 is a compound semiconductor that exhibits p-type conductivity.

In this embodiment, the n-type cladding layer 14, the active layer 15 and the p-type cladding layer 16 form an active region 150 that causes light to be generated. The thicknesses and the materials of the layers included in the active region 150 are appropriately set in accordance with the emission wavelength (for example, 850 nm). For example, GaAs and AlGaAs are respectively used in the quantum well layers and the barrier layers of the active layer 15. In addition, AlGaAs is used in the n-type DBR layer 13 and the p-type cladding layer 16.

However, the configuration of the active region is not limited to this configuration and for example a cladding layer need not be formed. Alternatively, a cladding layer may be formed on just one side of the active layer. In other words, the n-type cladding layer 14 and the p-type cladding layer 16 are not essential constituent elements.

The p-type DBR layer 17 is formed on the p-type cladding layer 16. The material of the p-type DBR layer 17 is a compound semiconductor that exhibits p-type conductivity and is AlGaAs for example. As an impurity for obtaining p-type conductivity, around $2 \times 10^{18}$ cm$^{-3}$ of carbon (C) is introduced for example.

The structure of the p-type DBR layer 17 is different from the structure of the n-type DBR layer 13 in that the number of pairs of a high-refractive-index layer and a low-refractive-index layer is smaller than in the n-type DBR layer 13. The number of pairs included in the n-type DBR layer 13 is 30 to 40, whereas the number of pairs included in the p-type DBR layer 17 is 20 for example. Thus, the p-type DBR layer 17 is formed such that the reflectivity of the p-type DBR layer 17 is somewhat lower than the reflectivity of the n-type DBR layer 13. The rest of the structure of the p-type DBR layer 17 is the same as that of the n-type DBR layer 13 and detailed description thereof will not be repeated.

The p-type contact layer 18 is formed on the p-type DBR layer 17. The material of the p-type contact layer 18 is a compound semiconductor that exhibits p-type conductivity. The p-type contact layer 18 is formed in order to realize with certainty ohmic contact between the p-type DBR layer 17 and the anode ohmic electrode 42.

The p-type DBR layer 17 may also serve as the p-type contact layer 18. In addition, the n-type DBR layer 13 may also serve as the n-type contact layer 12. In other words, the p-type contact layer 18 and the n-type contact layer 12 are not essential constituent components.

The current constriction layer 19 is formed at the interface between the p-type cladding layer 16 and the p-type DBR layer 17. The current constriction layer 19 includes an oxidized region 191 and a non-oxidized region 192. The oxidized region 191 is formed by oxidizing the current constriction layer 19 from the side surfaces of the current constriction layer 19 toward the center. The non-oxidized region 192 is a region substantially in the center of the current constriction layer 19 that remains without being oxidized. The material of the oxidized region 191 is AlGaAs for example. In the composition of the oxidized region 191, the composition ratio of Al to Ga is set so as to be high compared to the other layers and is $Al_{0.95}Ga_{0.05}As$ for example.

As a result of forming the current constriction layer 19, a current flowing from the p-type DBR layer 17 to the n-type DBR layer 13 can be locally concentrated and injected into the active region 150. Thus, oscillations are generated with even a low current and therefore high light emission efficiency can be realized. Therefore, the power consumption of the VCSEL element can be reduced.

The anode ohmic electrode 42 is formed on the p-type contact layer 18 so as to be in conductive contact with the p-type contact layer 18. The anode ohmic electrode 42 is for example an annular-shaped electrode when the xy plane is viewed in plan along the z direction (refer to FIG. 2). Light generated in the active region 150 is emitted through an emission aperture 421 in the center of the anode ohmic electrode 42 to the outside. The shape of the anode ohmic electrode 42 does not necessarily have to be an annular shape and for example may be a rectangular shape or a C shape formed by removing part of an annular shape.

A region in which the n-type DBR layer 13 is not formed is in the vicinity of the region in which the n-type cladding layer 14 is formed on the n-type contact layer 12. The cathode ohmic electrode 52 is formed in this region so as to be in conductive contact with the n-type contact layer 12. The cathode ohmic electrode 52 is for example an arc-shaped electrode when the xy plane is viewed along the z direction. The anode ohmic electrode 42 and the cathode ohmic electrode 52 respectively correspond to an "anode electrode" and a "cathode electrode" in the present disclosure.

The insulating grooves 91 and 92 each have a shape that is recessed from a front surface side of the base substrate 11 toward the inside of the base substrate 11. The insulating grooves 91 and 92 isolate layers of the VCSEL elements formed on the base substrate 11. The layers that are isolated by the insulating grooves 91 and 92 are conductive or semi-conductive semiconductor layers formed on the base substrate 11 and correspond to the n-type contact layer 12 and the n-type DBR layer 13 in this embodiment. The insulating grooves 91 and 92 respectively correspond to a "first insulating region insulating groove" and a "second insulating region insulating groove" in the present disclosure. In addition, it is preferable that the insulating grooves 91 and 92 be formed together in an integrated manner in order to reduce the number of steps.

By using a semiconductor substrate having a semi-insulating property as the base substrate 11, all of the VCSEL elements are electrically insulated from each other. In addition, by forming the insulating grooves 91 and 92, an electrical insulation property (isolation) between VCSEL elements that are adjacent to each other with the insulating grooves 91 and 92 therebetween can be further strengthened.

The parallel wiring lines 73 and 74 can be formed on the insulating grooves 91. The series wiring lines 61 can be formed on the insulating grooves 92. Thus, compared with the case where the series wiring lines 61 and the parallel wiring lines 73 and 74 are formed in different regions to the insulating grooves 91 and 92, the area occupied by the series wiring lines 61 and the parallel wiring lines 73 and 74 can be reduced. Therefore, the number of VCSEL elements obtained per wafer is increased. Therefore, the cost per VCSEL element can be reduced.

An insulating protective film 31 is formed so as to cover the surface of each of the above-described structures except for the anode ohmic electrode 42 and the cathode ohmic electrode 52. The insulating protective film 31 is composed of silicon nitride (SiN) for example. When silicon nitride is selected for the insulating protective film 31, the film stress of the insulating protective film 31 can be adjusted. In addition, a film composed of silicon nitride has excellent resistance to moisture.

An insulating layer 32 is formed on the insulating protective film 31 so as to surround each of the layers between the p-type contact layer 18 and the n-type cladding layer 14. The material of the insulating layer 32 is an insulating resin such as polyimide.

The anode electrode pad 41 is formed so as to be interposed between two cathode electrode pads 51 on the surface of the insulating layer 32. The electrode pads (anode electrode pad 41 and cathode electrode pads 51) are formed for the purpose of wire bonding. The anode electrode pad 41 is electrically connected to the anode ohmic electrode 42 via the anode routing wiring line 43. The cathode electrode pads 51 are electrically connected to the cathode ohmic electrode 52 via the cathode routing wiring lines 53.

By forming the electrode pads on the insulating layer 32, which has a certain thickness, parasitic capacitances generated between the electrode pads and the n-type DBR layer 13 are reduced. Thus, distortion of the waveform of a driving signal can be reduced when a driving signal (not illustrated) is input to the electrode pads of the VCSEL elements 1 to 3. However, the insulating layer 32 can be omitted.

Figure 5:
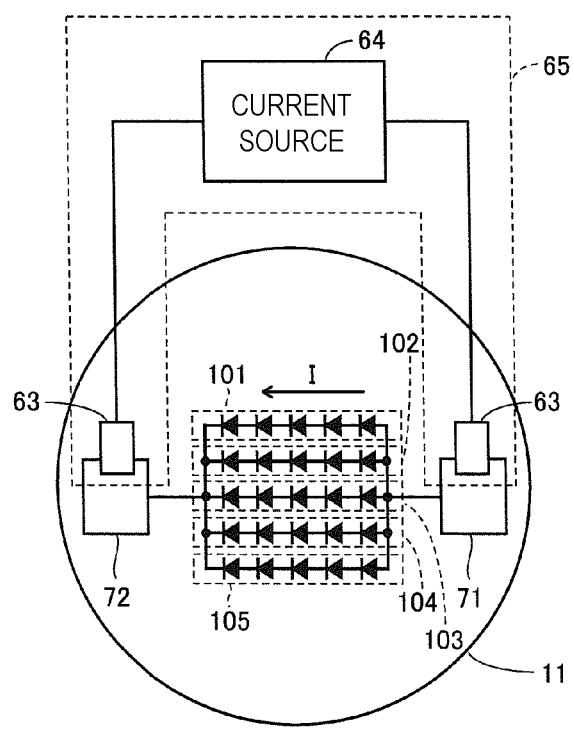
FIG. 5 is a circuit diagram that schematically illustrates the configuration of the vertical cavity surface emitting laser array illustrated in FIG. 1A at the time of a burn-in test.

FIG. 5 is a circuit diagram that schematically illustrates the configuration of the VCSEL array 901 illustrated in FIG. 1A at the time of a burn-in test. Referring to FIG. 5, a burn-in apparatus 65 includes a current source 64 and a pair of probes 63. The current source 64 supplies a load current with a magnitude of 5I between the probes 63 in order to supply a load current I to each VCSEL column. The probes 63 are electrically connected to the dummy pads 71 and 72.

As a result of forming the dummy pads 71 and 72, there is no need for the probes 63 to physically contact the electrode pads (refer to FIG. 2). Consequently, the electrode pads can be prevented from being damaged. In order to make contact with the probes 63 easy, it is preferable that the size of the dummy pads 71 and 72 be larger than the size of the electrode pads (typically less than 100 μm×100 μm) and for example is 200 μm×200 μm or more.

By applying a load voltage between the dummy pads 71 and 72, a load current I can be supplied to all of the VCSEL element columns 101 to 105. Consequently, the number of probes can be reduced compared with the case where a load current is supplied to each VCSEL element. Therefore, the cost of the burn-in apparatus can be reduced.

In FIGS. 1A to 5, a VCSEL array is illustrated in which VCSEL elements are arranged in a 5×5 matrix in a quadrangular region. However, the configuration of the VCSEL array is not limited to this configuration and it is sufficient that a matrix larger than a 2×2 matrix be adopted. The number of VCSEL elements is appropriately decided upon in accordance with the specifications of the burn-in apparatus 65, for example, the number of probes 63 or the value of the load current or load voltage that can be supplied by the current source 64.

Figure 6A:
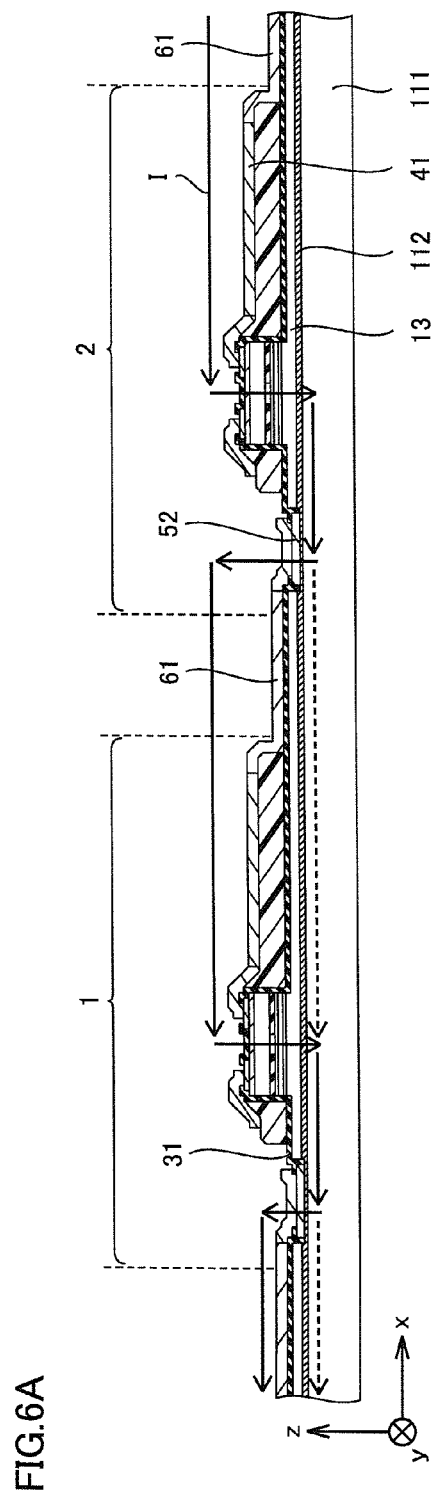
FIG. 6A illustrates the path of a load current in a vertical cavity surface emitting laser array for comparison.
Figure 6B:
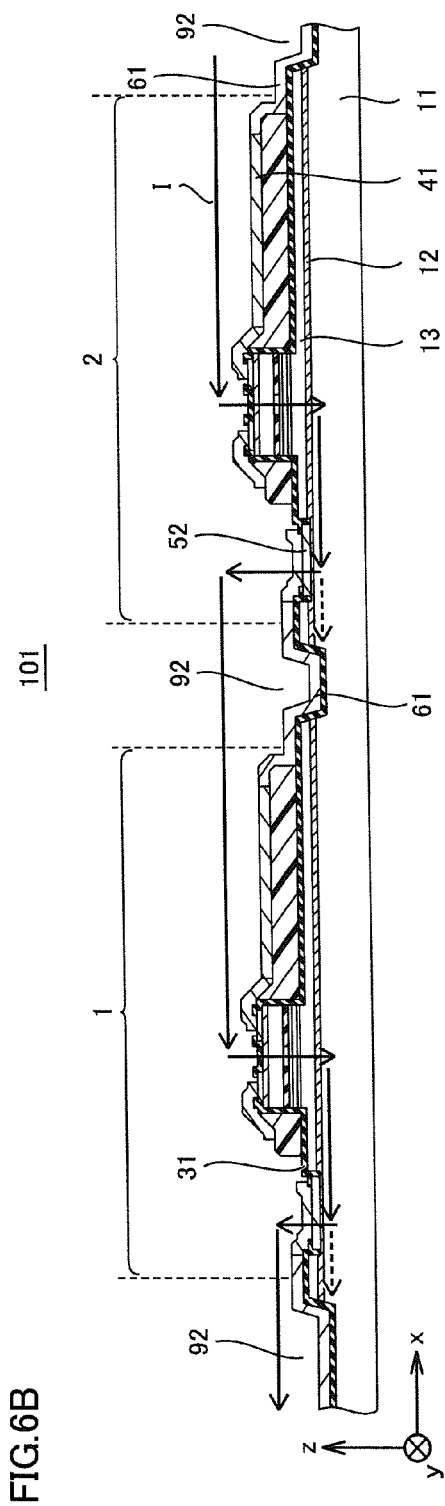
FIG. 6B illustrates the path of a load current in the vertical cavity surface emitting laser array illustrated in FIG. 3.

FIG. 6A illustrates the path (represented by a solid line) of a load current If in a VCSEL array for comparison. FIG. 6B illustrates the path of a load current If in the VCSEL element column 101 illustrated in FIG. 3.

The structure of the VCSEL element column illustrated in FIG. 6A differs from the structure of the VCSEL element column 101 in that a base substrate 111 is formed instead of the base substrate 11, an n-type-conductivity semiconductor layer 112 is formed instead of the n-type contact layer 12 and the insulating grooves 91 and 92 are not formed. The base substrate 111 is not particularly limited to having a semi-insulating property. The structures of other parts of the VCSEL element column illustrated in FIG. 6A are the same as the structures of the corresponding parts of the VCSEL element column 101 and therefore a detailed description thereof will not be repeated.

Referring to FIGS. 2 to 4 and 6A, the load current I is supplied to the anode electrode pad 41 of the VCSEL element 2 via the series wiring line 61. Inside the VCSEL element 2, the load current I reaches the n-type conductive semiconductor layer 112 along a path of anode electrode pad 41-anode routing wiring line 43-anode ohmic electrode 42-p-type contact layer 18-p-type DBR layer 17-current constriction layer 19-p-type cladding layer 16-active layer 15-n-type cladding layer-n-type DBR layer 13. The load current I is additionally supplied to the VCSEL element 1 along a path of n-type conductive semiconductor layer 112-cathode ohmic electrode 52-series wiring line 61.

In the structure illustrated in FIG. 6A, the VCSEL elements are connected to each other by the n-type-conductivity semiconductor layer 112 formed on the base substrate 111. Therefore, not all of the load current I that reaches the n-type conductive semiconductor layer 112 flows to the cathode ohmic electrode 52. Part of the load current I leaks to the VCSEL element 1 via the n-type-conductivity semiconductor layer 112 as a leakage current (indicated by broken line). As a result, the load currents I of the individual VCSEL elements are not uniform.

On the other hand, referring to FIGS. 2 to 4 and 6B, according to the first embodiment, the electrical insulation property between adjacent VCSEL elements is strengthened by the semi-insulating base substrate 11 and the insulating grooves 91 and 92. Consequently, it is difficult for a leakage current to flow via a conductive or semi-conductive semiconductor layer on the base substrate 11. Therefore, a uniform load current I can be simultaneously supplied to a plurality of VCSEL elements in the same VCSEL element column. Thus, a burn-in test can be accurately performed under the same load conditions (load current conditions).

Second Embodiment

In the first embodiment, the load conditions are the same for a plurality of VCSEL elements in the same VCSEL element column. According to a second embodiment, the load conditions can be made to be the same for different VCSEL element columns.

Figure 7:
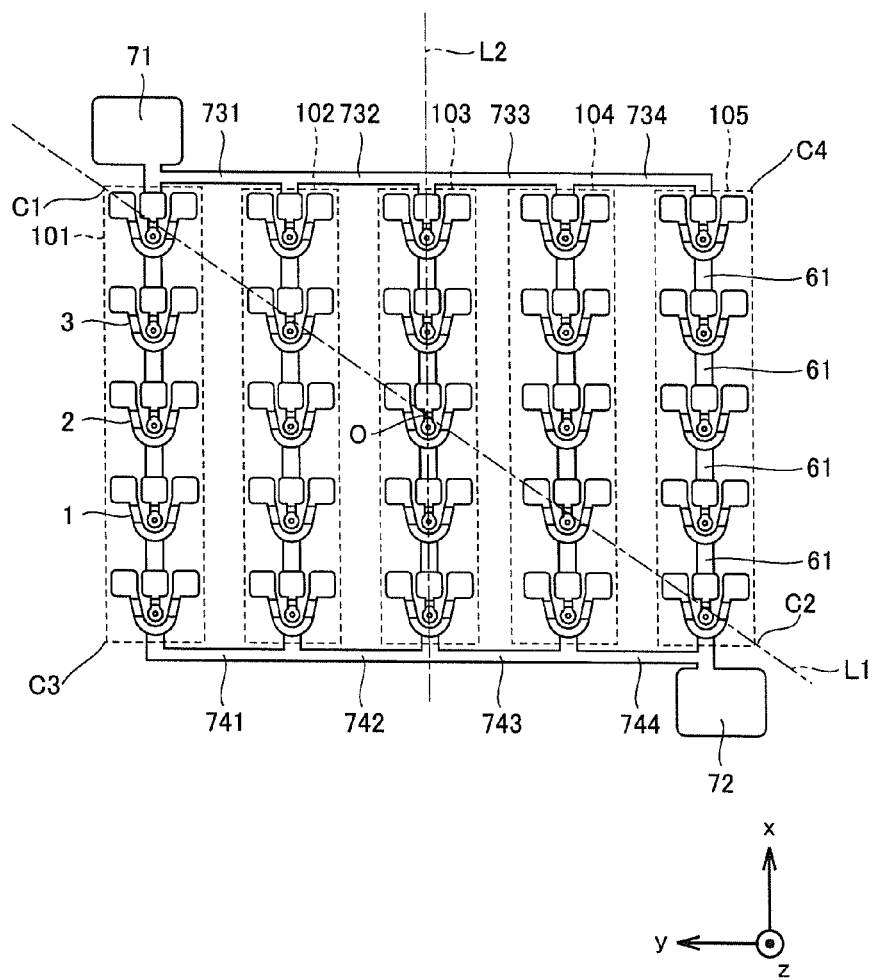
FIG. 7 is a plan view of a vertical cavity surface emitting laser array according to a second embodiment of the present disclosure.

FIG. 7 is a plan view of a VCSEL array according to the second embodiment of the present disclosure. FIG. 7 is to be contrasted with FIG. 1A.

Referring to FIG. 7, the configuration of a VCSEL array 902 differs from the configuration of the VCSEL array 901 (refer to FIG. 1A) in that the dummy pads 71 and 72 are arranged on a diagonal line L1 extending through the VCSEL element columns 101 to 105. In other words, the dummy pads 71 and 72 are arranged in the vicinities of corners C1 and C2 located on the diagonal line L1 among corners C1 to C4 (first to fourth corners) corresponding to the four corners of a quadrangular region in which the VCSEL elements are arranged. The configurations of other parts of the VCSEL array 902 are the same as the configurations of the corresponding parts of the VCSEL array 901 and therefore a detailed description thereof will not be repeated. In FIG. 7, in order to prevent the drawing from becoming complicated, the insulating grooves 91 and 92 are not illustrated.

Figure 8A:
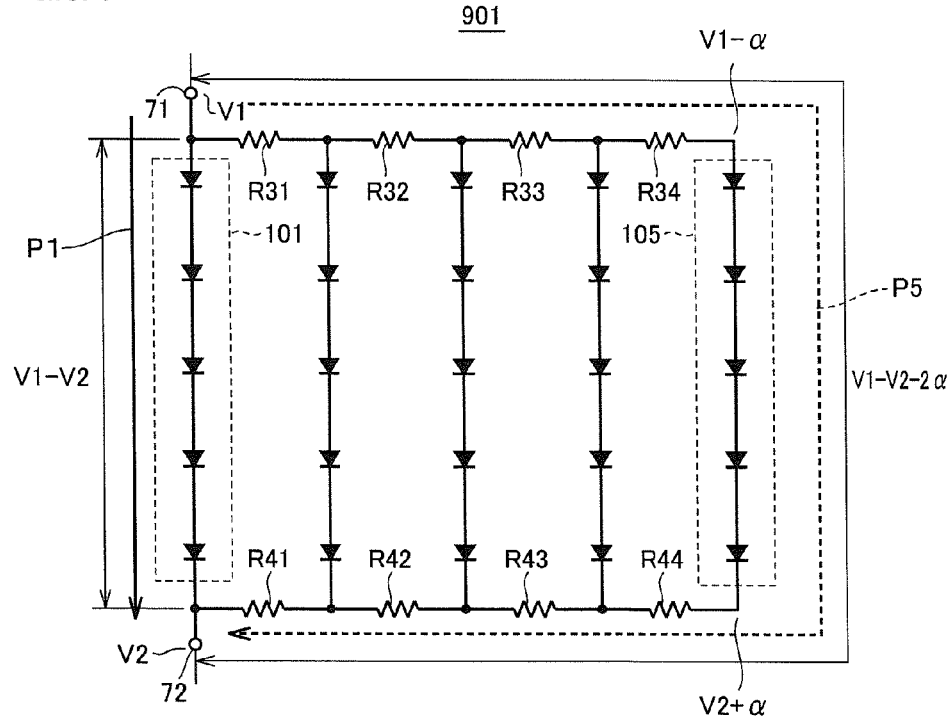
FIG. 8A is an equivalent circuit diagram that illustrates the path of a load current in the vertical cavity surface emitting laser array illustrated in FIG. 1A.
Figure 8B:
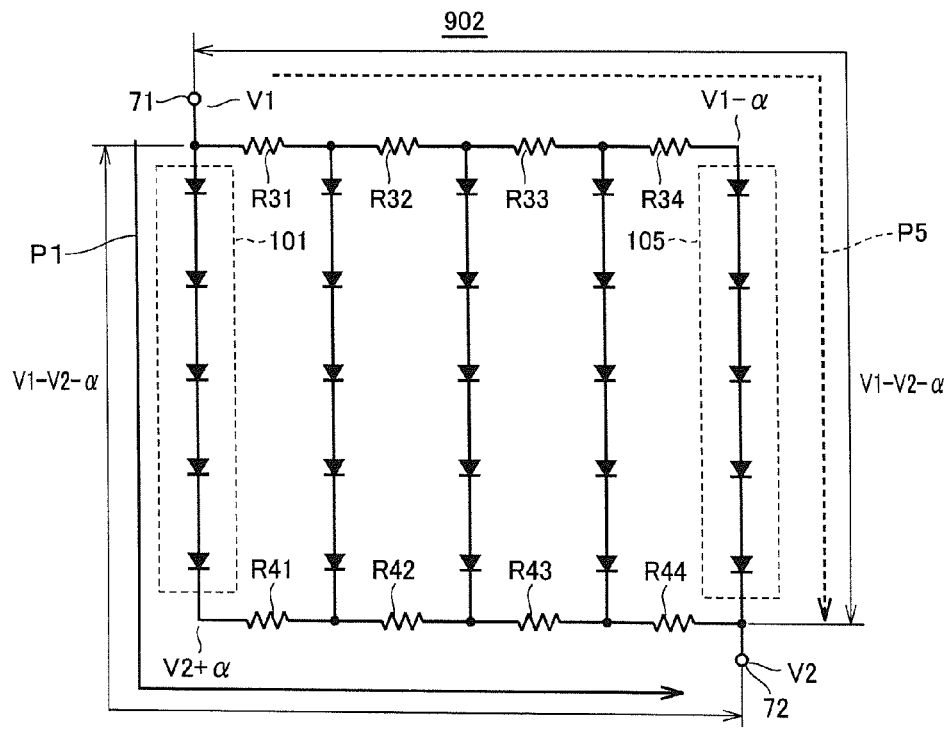
FIG. 8B is an equivalent circuit diagram that illustrates the path of a load current in the vertical cavity surface emitting laser array illustrated in FIG. 7.

FIG. 8A is an equivalent circuit diagram that illustrates the path of a load current in the VCSEL array 901 illustrated in FIG. 1A. FIG. 8B is an equivalent circuit diagram that illustrates the path of a load current in the VCSEL array 902 illustrated in FIG. 7.

Referring to FIGS. 1A and 8A, the dummy pads 71 and 72 of the VCSEL array 901 are arranged in the column direction (x direction). Accordingly, the load current that flows through the VCSEL element column 101 flows along a path P1 (represented by a solid line) of dummy pad 71-VCSEL element column 101-dummy pad 72. That is, since there are no resistances included in the path P1, voltage drops at resistances do not occur when the load current flows along the path P1. Therefore, if the potentials of the dummy pads 71 and 72 are respectively represented by V1 and V2, the potential difference between the dummy pads 71 and 72 on the path P1 is expressed by (V1−V2).

On the other hand, a load current that flows through the VCSEL element column 105 flows along a path P5 (represented by a dotted line) of dummy pad 71-resistance R31-resistance R32-resistance R33-resistance R34-VCSEL element column 105-resistance R44-resistance R43-resistance R42-resistance R41-dummy pad 72. That is, since there are eight resistances included along the path P5, voltage drops corresponding to the eight resistance components occur when the load current flows along the path P5. The resistance values of all the resistances are the same. Therefore, if the sum of voltage drops at the resistances R31 to R34 is denoted by α, the sum of the voltage drops at the resistances R41 to R44 is also α. Therefore, the potential difference between the dummy pads 71 and 72 along the path P5 is expressed by (V1−V2−2α).

Thus, the load current flows through different numbers of resistances along the path P1 and along the path P5 in the arrangement of the dummy pads 71 and 72 in the first embodiment. Consequently, there are different load voltages in the VCSEL element columns 101 and 105.

In contrast to this, referring to FIGS. 7 and 8B, in the VCSEL array 902, the dummy pads 71 and 72 are arranged on the diagonal line L1. Consequently, the load current that flows through the VCSEL element column 101 flows along a path P1 (represented by a solid line) of dummy pad 71-VCSEL element column 101-resistance R41-resistance R42-resistance R43-resistance R44-dummy pad 72. That is, four resistances are included along the path P1.

In addition, the load current that flows through the VCSEL element column 105 flows along a path P5 (represented by a dotted line) of the dummy pad 71-resistance R31-resistance R32-resistance R33-resistance R34-VCSEL element column 105-dummy pad 72. That is, four resistances are included along the path P5.

The sum of the voltage drops at the resistances R41 to R44 on the path P1 and the sum of the voltage drops at the resistances R31 to R34 on the path P5 are a and are equal to each other. Therefore, the potential difference between the dummy pads 71 and 72 along the path P1 and the potential difference between the dummy pads 71 and 72 along the path P5 are the same and are expressed by (V1−V2−α).

As described above, according to the second embodiment, the dummy pads 71 and 72 are arranged on the diagonal line L1. In addition, the VCSEL element columns 101 and 105 and the parallel wiring lines 73 and 74 are symmetrically arranged about an axis of symmetry L2 that passes through a center point O of the quadrangular shape in the column direction (x direction). Accordingly, the sizes of the voltage drops at the resistances are the same along the paths P1 and P5. Therefore, the load conditions can be made the same for the VCSEL element columns 101 and 105. Furthermore, the VCSEL element columns 102 to 104 are also similarly symmetrically arranged about the axis of symmetry L2. Consequently, although the description will not be repeated, the load conditions are also the same for the VCSEL element columns 102 to 104.

Third Embodiment

In the second embodiment, the load conditions are the same for VCSEL element columns symmetrically positioned about the axis of symmetry L2. According to a third embodiment, the load conditions can be made to be the same for all of the VCSEL element columns.

Figure 9:
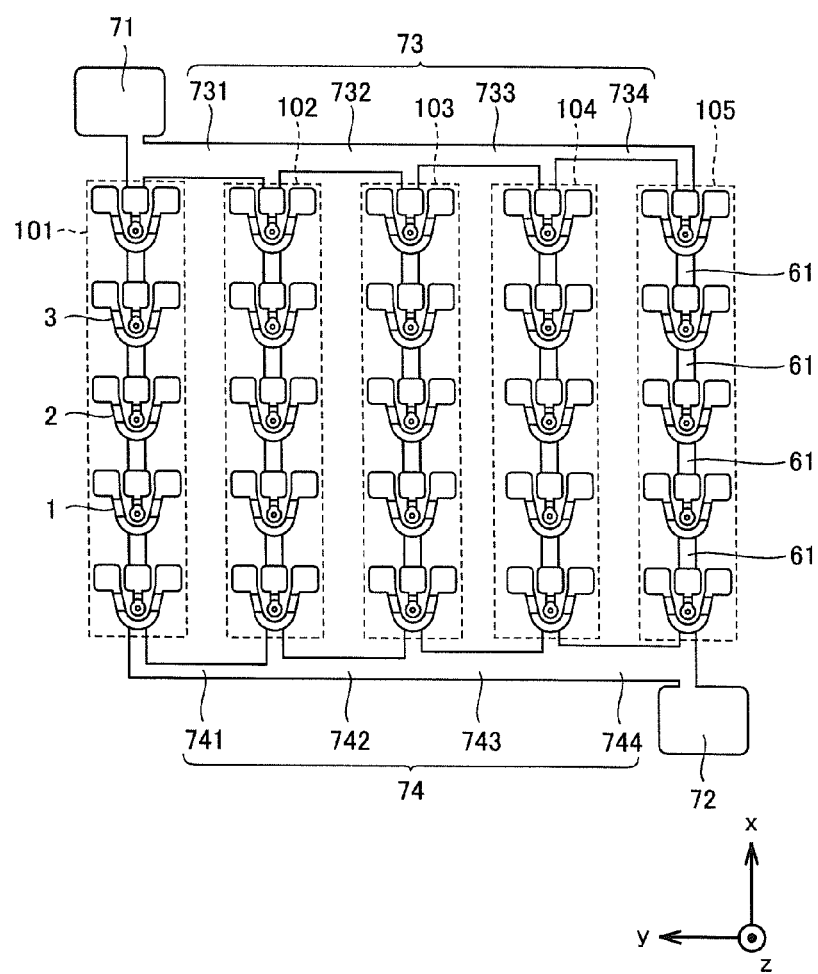
FIG. 9 is a plan view of a vertical cavity surface emitting laser array according to a third embodiment of the present disclosure.

FIG. 9 is a plan view of a VCSEL array according to the third embodiment of the present disclosure. Referring to FIG. 9, the wiring line width of the parallel wiring line 73 is set so as to become smaller in order of the wiring line portions 731 to 734. Thus, the resistance value of the parallel wiring line 73 becomes larger in this order. On the other hand, the wiring line width of the parallel wiring line 74 is set so as to become larger in the order of the wiring line portions 741 to 744. Thus, the resistance value of the parallel wiring line 74 becomes smaller in this order. The configurations of other parts of a VCSEL array 903 are the same as the configurations of the corresponding parts of the VCSEL array 902 (refer to FIG. 7) and therefore detailed description thereof will not be repeated.

Figure 10A:
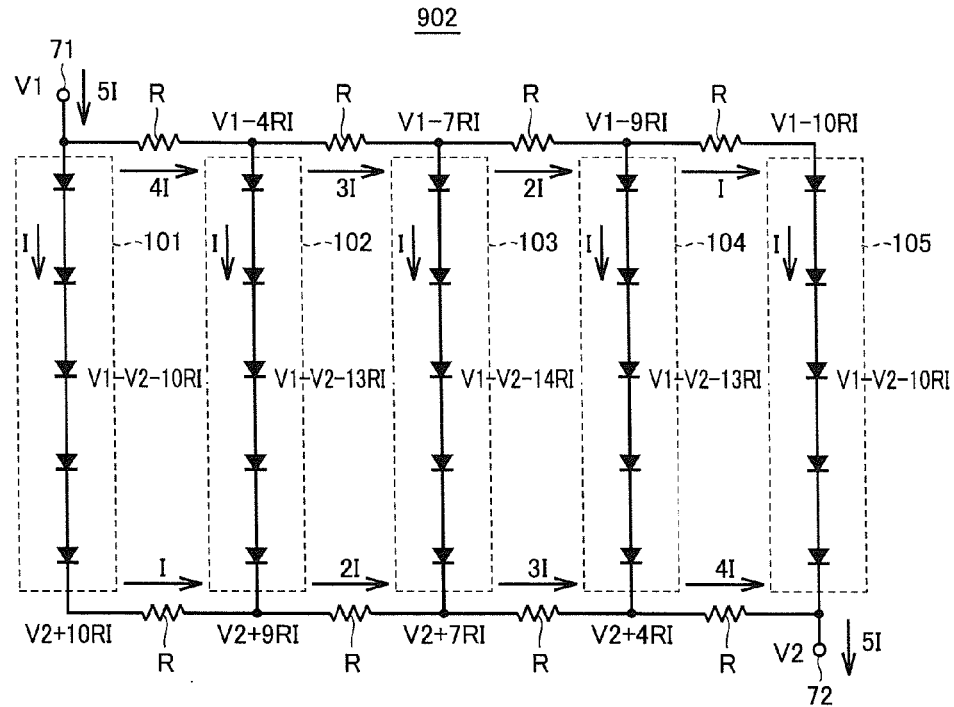
FIG. 10A is an equivalent circuit diagram of the vertical cavity surface emitting laser array illustrated in FIG. 7.
Figure 10B:
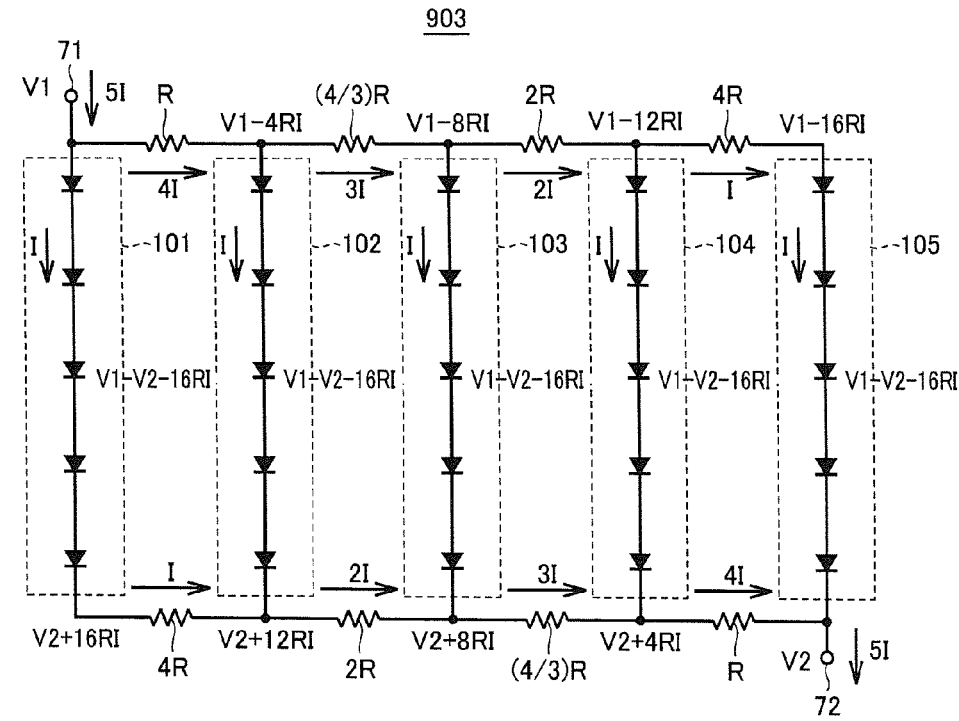
FIG. 10B is an equivalent circuit diagram of the vertical cavity surface emitting laser array illustrated in FIG. 9.

FIG. 10A is an equivalent circuit diagram of the VCSEL array 902 illustrated in FIG. 7. FIG. 10B is an equivalent circuit diagram of the VCSEL array 903 illustrated in FIG. 9.

Referring to FIG. 10A, a load current with a magnitude of 5I is supplied to the VCSEL array 902 via the dummy pad 71. A load current I is equally distributed to each of the VCSEL element columns 101 to 105. Accordingly, load currents of 4I, 3I, and I respectively flow through the resistances R31 to R34 (refer to FIG. 8B). The resistance values of the resistances are the same, namely, R. Therefore, the sizes of the voltage drops at the resistances R31 to R34 are 4RI, 3RI, 2RI and RI, respectively.

On the other hand, load currents of I, 2I, 3I and 4I respectively flow through the resistances R41 to R44 (refer to FIG. 8B). Therefore, the sizes of the voltage drops at the resistances R41 to R44 are RI, 2RI, 3RI and 4RI, respectively. Thus, in the VCSEL array 902, there is a voltage drop of a different size at every resistance. The potentials at the intersection points are noted in the vicinities of the intersection points between the VCSEL element columns 101 to 105 and the resistances in the figure.

The potential difference of the VCSEL element column 101 (potential difference between the VCSEL elements at the two ends of the VCSEL element column 101) and the potential difference of the VCSEL element column 105 are both calculated as (V1−V2−10RI). However, the potential difference of the VCSEL element column 102 and the potential difference of the VCSEL element column 104 are calculated as (V1−V2−13RI). In addition, the potential difference of the VCSEL element column 103 is calculated as (V1−V2−14RI). Thus, in the second embodiment, the potential differences of the VCSEL element columns are different from one another.

In contrast to this, referring to FIG. 10B, the resistance values of the resistances in the VCSEL array 903 are each set by adjusting the wiring line width on the basis of a simulation for example so as to be inversely proportional to the value of the load current that will flow through the resistance. That is, the resistance value of the resistances R34 and R41 is 4R. The resistance value of the resistances R33 and R42 is 2R. The resistance value of the resistances R32 and R43 is (4/3)R. The resistance value of the resistances R31 and R44 is R. By setting the resistance values in this way, the sizes of voltage drops at the resistances become equal to one another, namely, 4RI. As a result, the potential differences of all of the VCSEL element columns become equal to one another, namely, (V1−V2−16RI).

As described above, according to the third embodiment, the resistance values of the wiring line portions of the parallel wiring lines are each set so as to be inversely proportional to the value of the load current that will flow through the wiring line portion. Thus, the sizes of the voltage drops at the resistance components of the wiring line portions become equal to one another. Therefore, the load conditions of all the VCSEL element columns can be made to be the same as one another.

The method of adjusting the resistance values of the wiring line portions is not limited to adjusting the wiring line width. The resistance values of the wiring line portions can also be adjusted by changing the thicknesses or the materials of the wiring line portions for example. However, if the wiring line width is adjusted, a plurality of wiring line portions of different wiring line widths can be formed in a single electrode forming process and therefore the manufacturing process can be simplified.

Fourth Embodiment

Figure 11A:
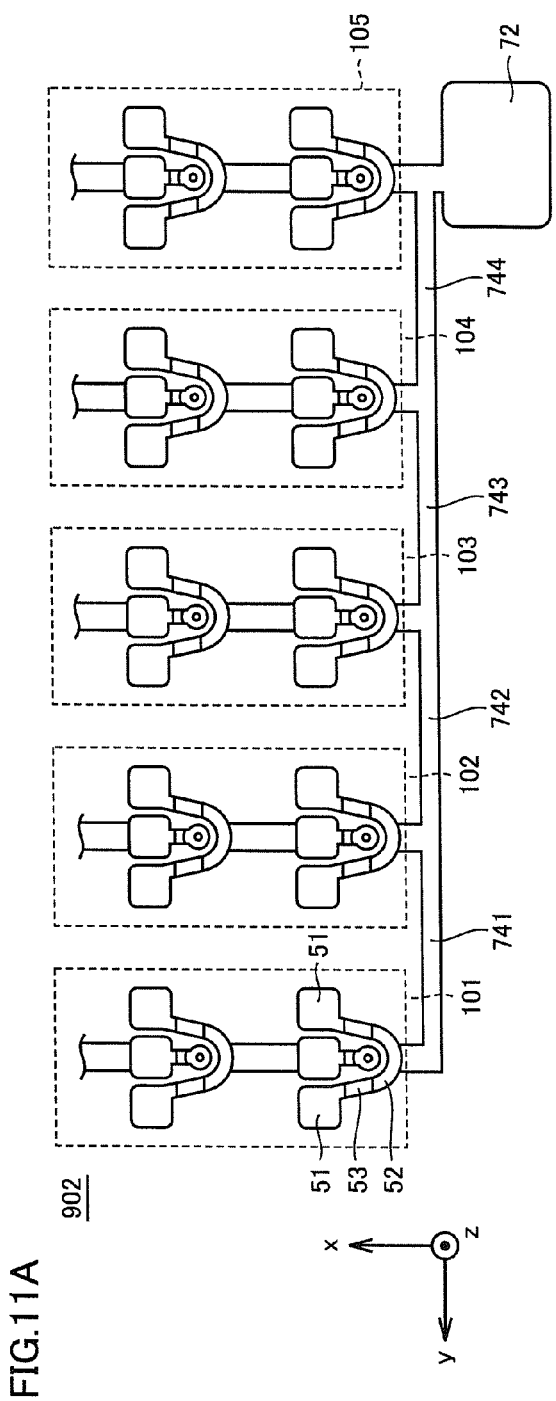
FIG. 11A is an enlarged view of the vertical cavity surface emitting laser array illustrated in FIG. 7.
Figure 11B:
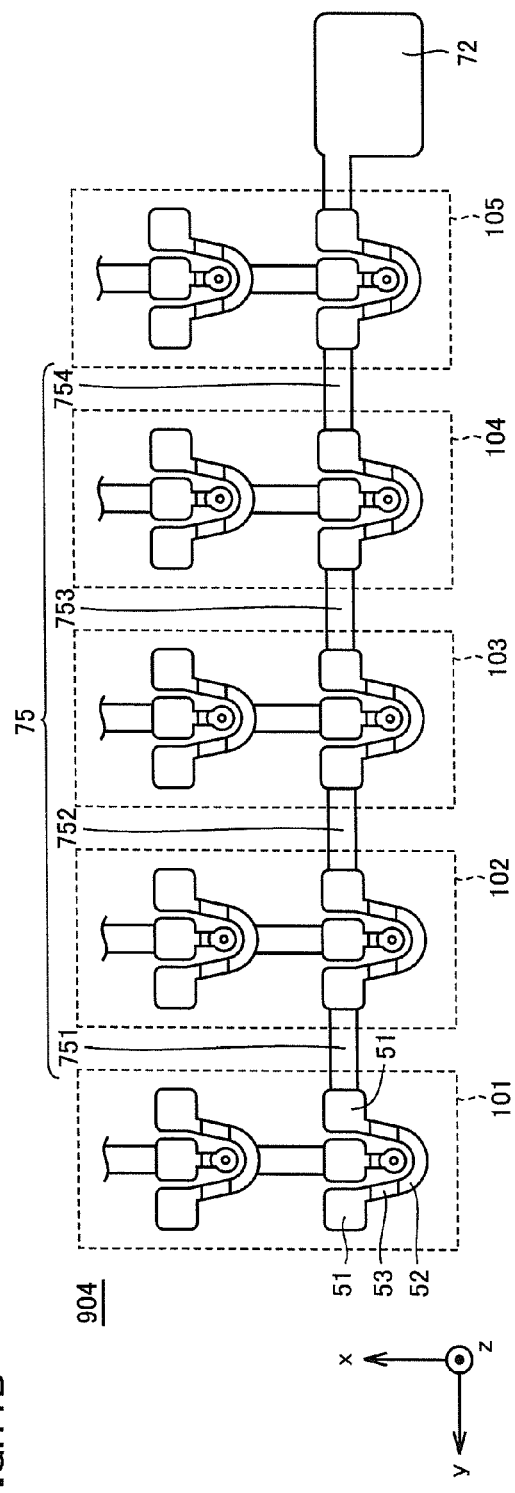
FIG. 11B is an enlarged view of the vertical cavity surface emitting laser array according to a fourth embodiment of the present disclosure.

FIG. 11A is an enlarged view of the VCSEL array 902 illustrated in FIG. 7. FIG. 11B is an enlarged view of a VCSEL array according to a fourth embodiment of the present disclosure. The configurations of parts of a VCSEL array 904 that are not illustrated are the same as the configurations of the corresponding parts of the VCSEL array 902.

Referring to FIG. 11A, the parallel wiring line 74 is connected to the cathode ohmic electrodes 52 of the VCSEL elements. With this connection configuration, it is necessary that a region in which to arrange the parallel wiring line 74 be secured between the VCSEL element columns 101 to 105 and the dummy pad 72 in the column direction (x direction).

In contrast to this, referring to FIG. 11B, a VCSEL array 904 is provided with a parallel wiring line 75 instead of the parallel wiring line 74. The parallel wiring line 75 includes wiring line portions 751 to 754. Each of the wiring line portions 751 to 754 is arranged between one cathode electrode pad 51 and another cathode electrode pad 51 of two VCSEL elements that are adjacent to each other in the row direction (y direction).

According to the fourth embodiment, it is not necessary to secure a region in which to arrange the parallel wiring line outside of the quadrangular region in which the VCSEL elements are arranged. Therefore, the area of the VCSEL array can be reduced. Consequently, with the VCSEL array 904, a greater number of VCSEL elements can be arranged within a fixed area compared with the VCSEL array 902. Therefore, the number of VCSEL elements obtained per wafer is increased. Therefore, the cost per unit VCSEL element can be reduced.

Fifth Embodiment

Figure 12:
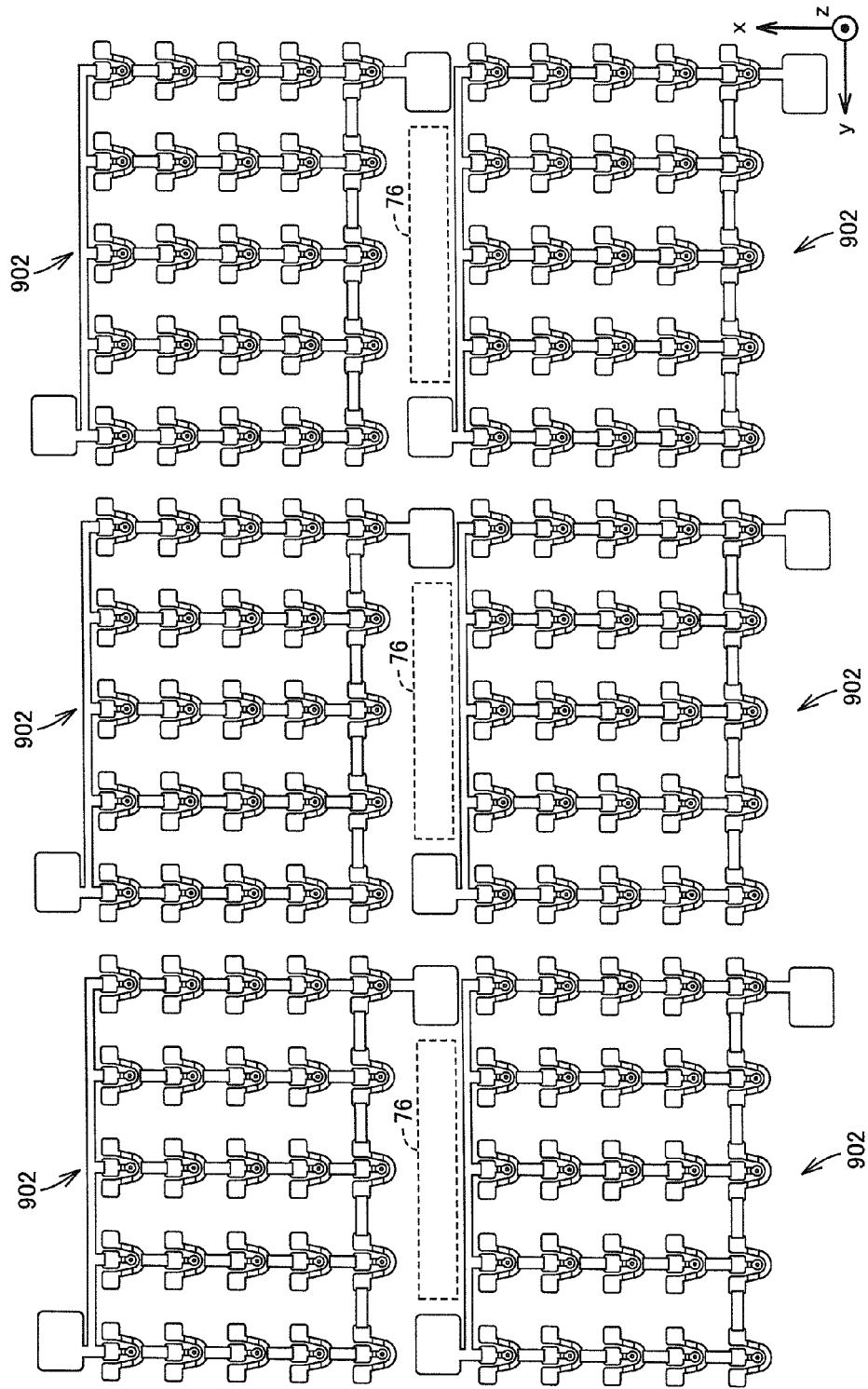
FIG. 12 illustrates a state in which a plurality of the vertical cavity surface emitting laser arrays illustrated in FIG. 7 are arranged.

FIG. 12 illustrates a state in which six of the VCSEL arrays 902 illustrated in FIG. 7 are arranged. Referring to FIG. 12, dead spaces 76 are generated between every two of the VCSEL arrays 902 arranged in the column direction (x direction). No VCSEL elements or any type of wiring line is arranged in the dead spaces 76. Therefore, the number of VCSEL elements obtained per wafer is reduced by an amount corresponding to the area of the dead spaces 76.

Figure 13A:
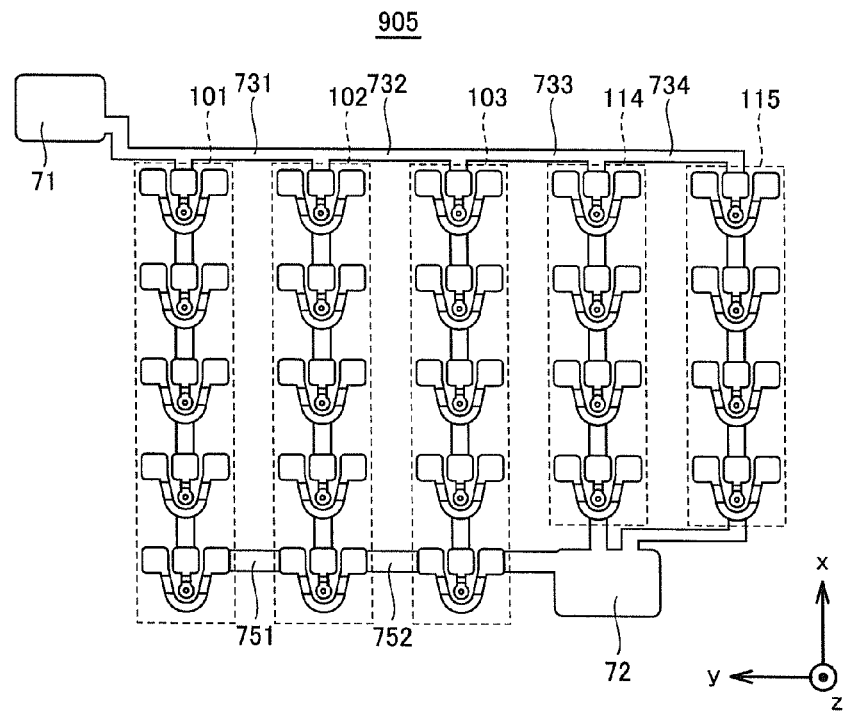
FIG. 13A is a plan view of a vertical cavity surface emitting laser array according to a fifth embodiment of the present disclosure.
Figure 13B:
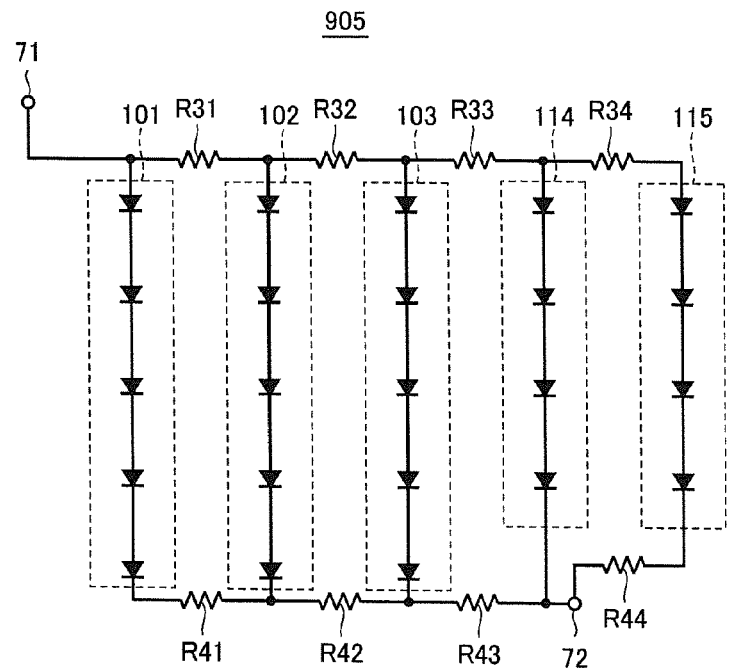
FIG. 13B is an equivalent circuit diagram of the vertical cavity surface emitting laser array according to the fifth embodiment of the present disclosure.

FIG. 13A is a plan view of a VCSEL array according to a fifth embodiment of the present disclosure. FIG. 13B is an equivalent circuit diagram of the VCSEL array according to the fifth embodiment of the present disclosure. FIG. 13A is to be contrasted with FIG. 11B.

Referring to FIG. 13A, the configuration of the VCSEL array 905 differs from the configuration of the VCSEL array 904 (refer to FIG. 11B) in that VCSEL element columns 114 and 115 are provided instead of the VCSEL element columns 104 and 105.

The number n of VCSEL elements included in each of the VCSEL element column 114 and 115 (n=4) is smaller than the number m of VCSEL elements included in each of the VCSEL element columns 101 to 103 (m=5). The dummy pad 72 is arranged in place of one VCSEL element that would have otherwise been included in the VCSEL element column 114 and one VCSEL element that would have otherwise been included in the VCSEL element column 115. In other words, the dummy pad 72 is arranged in a region corresponding to the areas of VCSEL elements in the vicinity of the VCSEL element columns 114 and 115. The rest of the configuration of the VCSEL array 905 is the same as that of the VCSEL array 904 and a detailed description thereof will not be repeated.

The VCSEL element columns 101 to 103 correspond to a "first vertical cavity surface emitting laser element column" in the present disclosure. The VCSEL element columns 114 and 115 correspond to a "second vertical cavity surface emitting laser element column" in the present disclosure. In addition, although a case in which the dummy pad 72 is arranged has been described, the dummy pad 71 could also be similarly arranged.

Figure 14:
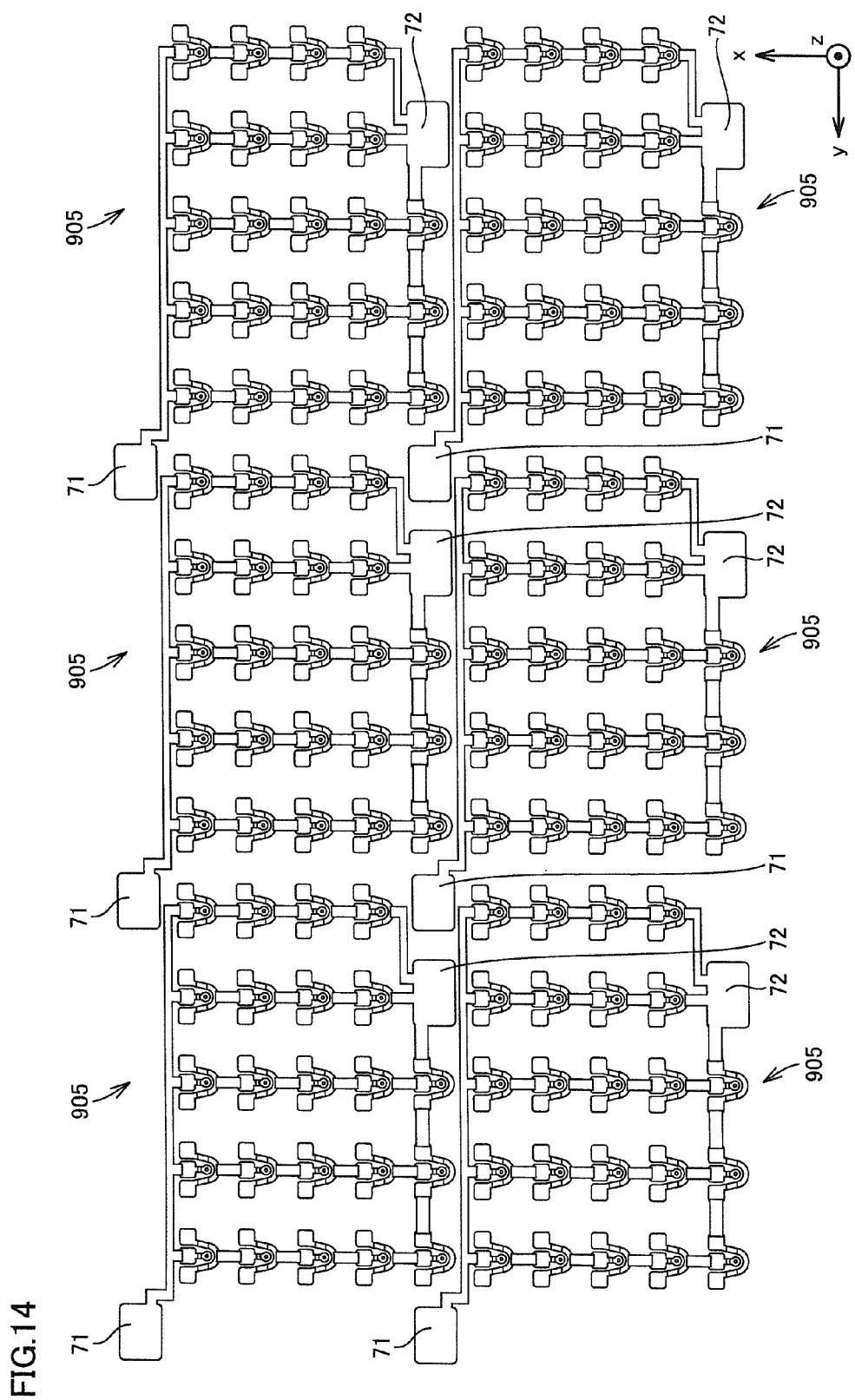
FIG. 14 illustrates a state in which a plurality of the vertical cavity surface emitting laser arrays illustrated in FIG. 13A are arranged.

FIG. 14 illustrates a state in which six of the VCSEL arrays 905 illustrated in FIG. 13A are arranged. FIG. 14 is to be contrasted with FIG. 12.

Referring to FIG. 14, as a result of arranging the dummy pads 72 in regions corresponding to the areas of VCSEL elements as described above, a dead space is no longer generated between two VCSEL arrays 905 arranged in the column direction (x direction). In addition, arranging the dummy pads 71 in spaces adjacent to the dummy pads 72 in the row direction (y direction) also contributes to the reduction of dead spaces. Therefore, with the VCSEL array 905, a greater number of VCSEL arrays can be arranged on the base substrate 11 (wafer) compared with the VCSEL array 902 (refer to FIG. 11A). As a result, the cost per unit VCSEL element can be reduced.

Sixth Embodiment

Returning to FIG. 13B, the number of VCSEL elements included in each of the VCSEL element columns 114 and 115 is smaller than the number of VCSEL elements included in each of the VCSEL element columns 101 to 103. Accordingly, the load voltage applied to each VCSEL element is higher in the VCSEL element columns 114 and 115 than in the VCSEL element columns 101 to 103. Therefore, the load conditions are different in the VCSEL element columns 101 to 103 and in the VCSEL element columns 114 and 115.

Figure 15A:
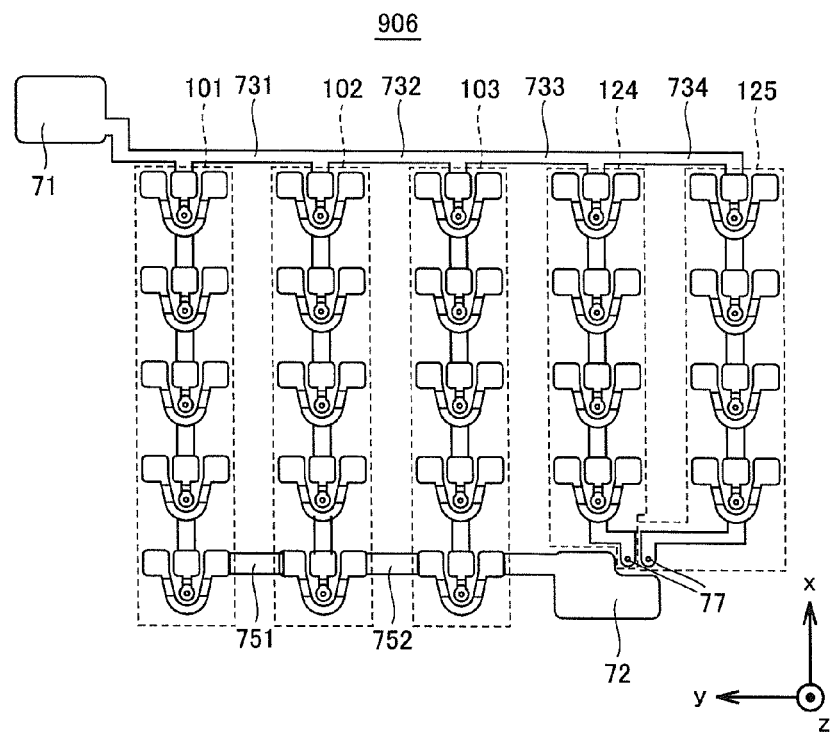
FIG. 15A is a plan view of a vertical cavity surface emitting laser array according to a sixth embodiment of the present disclosure.
Figure 15B:
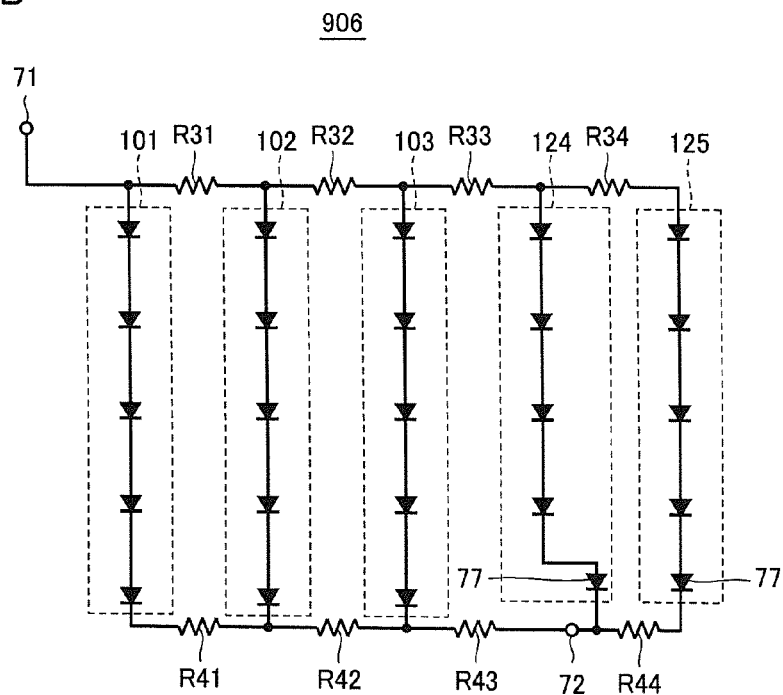
FIG. 15B is an equivalent circuit diagram of the vertical cavity surface emitting laser array according to the sixth embodiment of the present disclosure.

FIG. 15A is a plan view of a VCSEL array according to a sixth embodiment of the present disclosure. FIG. 15B is an equivalent circuit diagram of the VCSEL array according to the sixth embodiment of the present disclosure. FIGS. 15A and 15B are to be contrasted with FIGS. 13A and 13B.

Referring to FIG. 15A, VCSEL element columns 124 and 125 are different to the VCSEL element columns 114 and 115 (refer to FIG. 13A) in that the VCSEL element columns 124 and 125 each include a dummy element 77. The dummy element 77 included in the VCSEL element column 124 is electrically connected between the dummy pad 72 and the VCSEL elements inside the VCSEL element column 124. The dummy element 77 included in the VCSEL element column 125 is electrically connected between the dummy pad 72 and the VCSEL elements inside the VCSEL element column 125.

The dummy elements 77 are elements that are formed in order to generate a voltage drop and are for example diodes. The sizes of the voltage drops at the dummy elements 77 correspond to the sizes of voltage drops of VCSEL elements corresponding to the region in which the dummy pad 72 is arranged.

According to the sixth embodiment, the load voltage applied to each VCSEL element is the same in the VCSEL element columns 101 to 103 and in the VCSEL element column 124 and 125. Therefore, along with it being possible to arrange a plurality of VCSEL arrays without the generation of dead spaces, the load conditions can be made the same for all the VCSEL element columns.

Method of Manufacturing VCSEL Array

Hereafter, a method of manufacturing the VCSEL arrays 901 to 906 according to the first to sixth embodiments will be described. The methods of manufacturing the VCSEL arrays 901 to 906 are the same and therefore a method of manufacturing the VCSEL array 901 will be described as a representative example.

Figure 16:
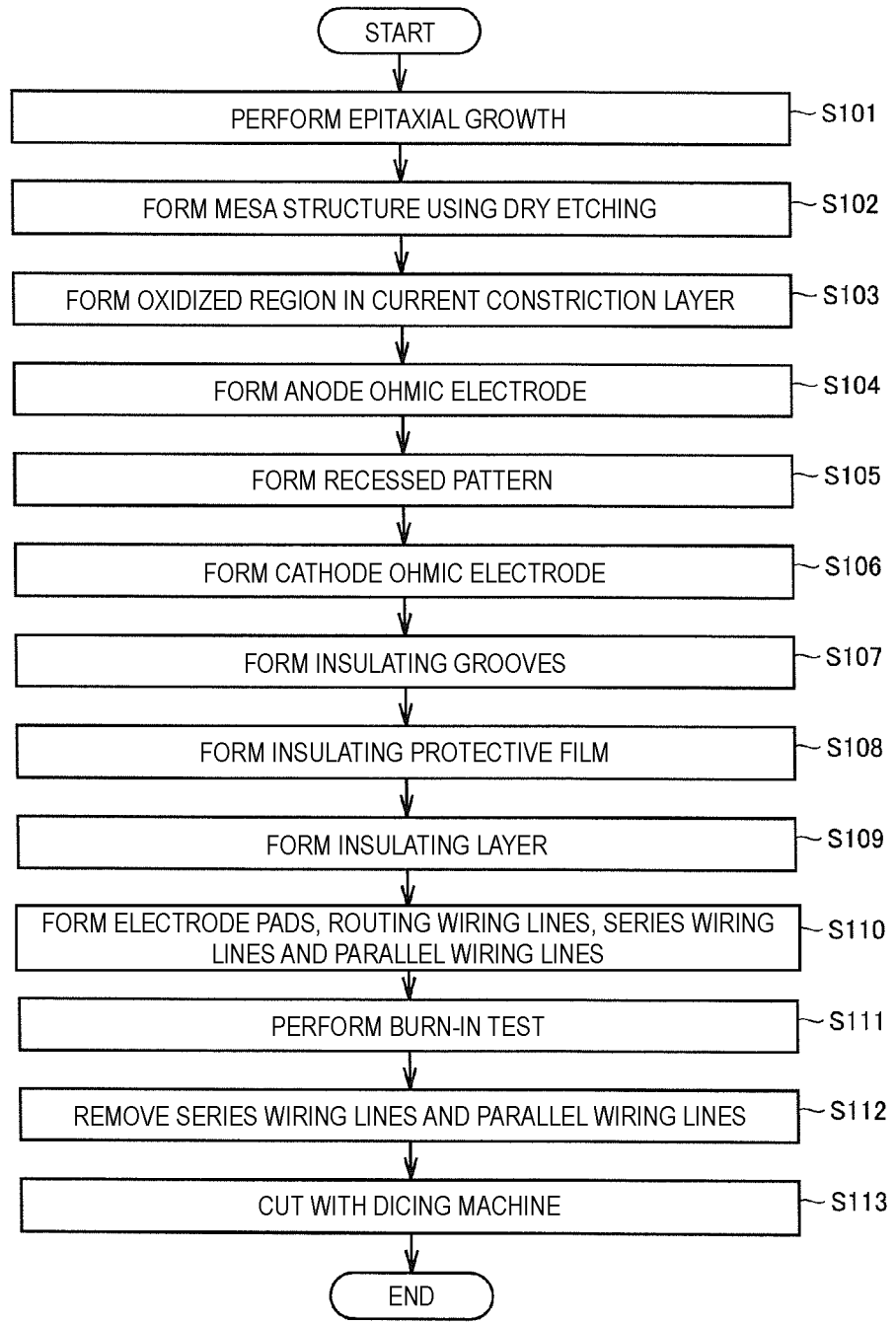
FIG. 16 is a flowchart for explaining a method of manufacturing a vertical cavity surface emitting laser array according to any of the first to sixth embodiments of the present disclosure.

FIG. 16 is a flowchart for explaining the method of manufacturing the VCSEL array 901 illustrated in FIG. 1A. FIGS. 17 to 27 are schematic step diagrams for the method of manufacturing the VCSEL array 901 illustrated in FIG. 1A. In the following description, the corresponding steps of the flowchart illustrated in FIG. 16 are given in brackets.

Figure 17:
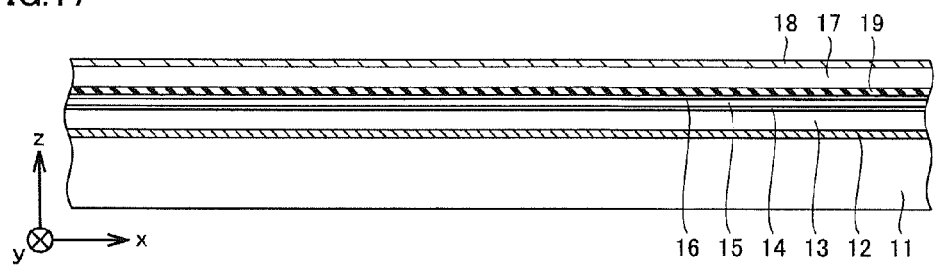
FIG. 17 is a schematic step diagram illustrating an epitaxial growth step in the method of manufacturing a vertical cavity surface emitting laser array according to any of the first to sixth embodiments of the present disclosure.

Referring to FIG. 17, first, the n-type contact layer 12, the n-type DBR layer 13, the n-type cladding layer 14, the active layer 15, the p-type cladding layer 16, the current constriction layer 19, the p-type DBR layer 17 and the p-type contact layer 18 are formed in order from the surface of the base substrate 11 by epitaxial growth (step S101).

For example, metal organic chemical vapor deposition (MOCVD) or molecular beam epitaxy may be employed as the method of epitaxial growth. The temperature and duration of the epitaxial growth are decided upon in accordance with the growth method, the type of the base substrate 11, or the type and thickness of each layer, or the carrier density and so forth.

Figure 18:
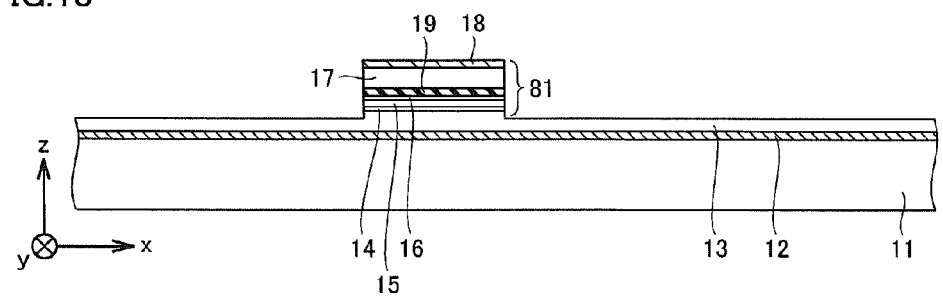
FIG. 18 is a schematic step diagram illustrating a photolithography and dry etching step in the method of manufacturing a vertical cavity surface emitting laser array according to any of the first to sixth embodiments of the present disclosure.

Referring to FIG. 18, the pattern of each layer between the p-type contact layer 18 and the n-type cladding layer 14 is formed using photolithography for example. In the region outside the region where this pattern is formed, the layers from the p-type contact layer 18 up to the n-type cladding layer 14 are removed sequentially by using dry etching for example such that the n-type DBR layer 13 is exposed. In this way, a mesa structure 81 is formed (step S102).

Figure 19:
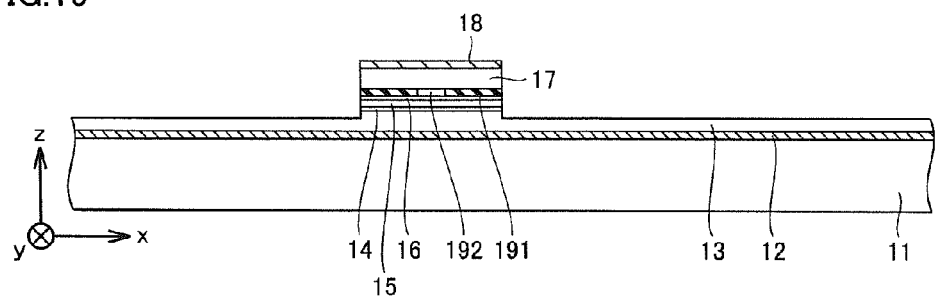
FIG. 19 is a schematic step diagram illustrating an oxidized region formation step in the method of manufacturing a vertical cavity surface emitting laser array according to any of the first to sixth embodiments of the present disclosure.

Referring to FIG. 19, oxidation is made to selectively proceed from the outer periphery of the current constriction layer 19 by performing heating at 400° C. or more in a steam atmosphere. In this way, the oxidized region 191 and the non-oxidized region 192 are formed (step S103).

Figure 20:
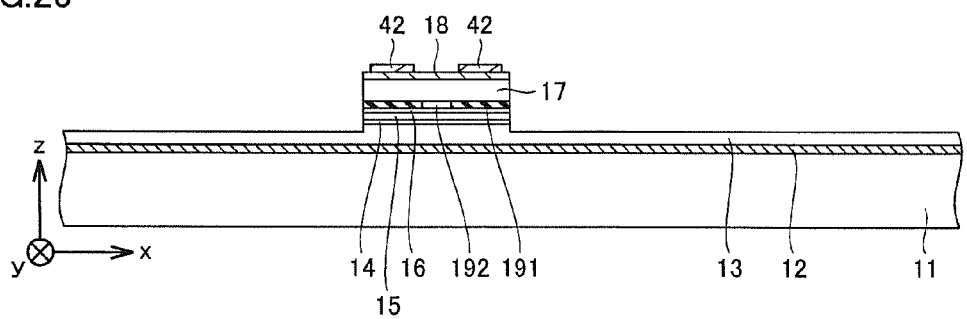
FIG. 20 is a schematic step diagram illustrating an anode ohmic electrode formation step in the method of manufacturing a vertical cavity surface emitting laser array according to any of the first to sixth embodiments of the present disclosure.

Referring to FIG. 20, the anode ohmic electrode 42 is formed on the p-type contact layer 18 (step S104).

Figure 21:
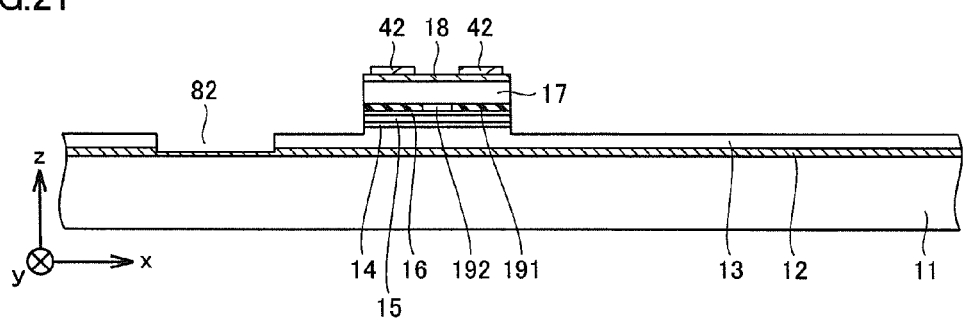
FIG. 21 is a schematic step diagram illustrating a recessed pattern formation step in the method of manufacturing a vertical cavity surface emitting laser array according to any of the first to sixth embodiments of the present disclosure.

Referring to FIG. 21, in this embodiment, the n-type contact layer 12 is formed closer toward the rear surface side of the base substrate 11 than the n-type DBR layer 13 is. Therefore, a recessed pattern 82 is formed by photolithography and etching. As a result, the n-type contact layer 12 is exposed (step S105).

Figure 22:
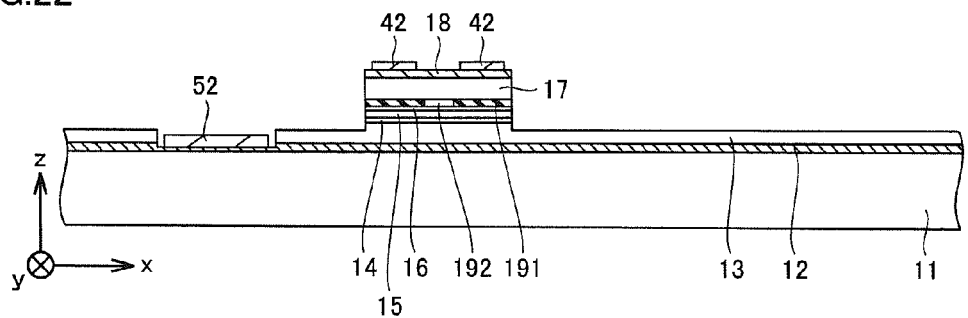
FIG. 22 is a schematic step diagram illustrating a cathode ohmic electrode formation step in the method of manufacturing a vertical cavity surface emitting laser array according to any of the first to sixth embodiments of the present disclosure.

Referring to FIG. 22, the cathode ohmic electrode 52 is formed on the exposed part of the n-type contact layer 12 (step S106).

Figure 23:
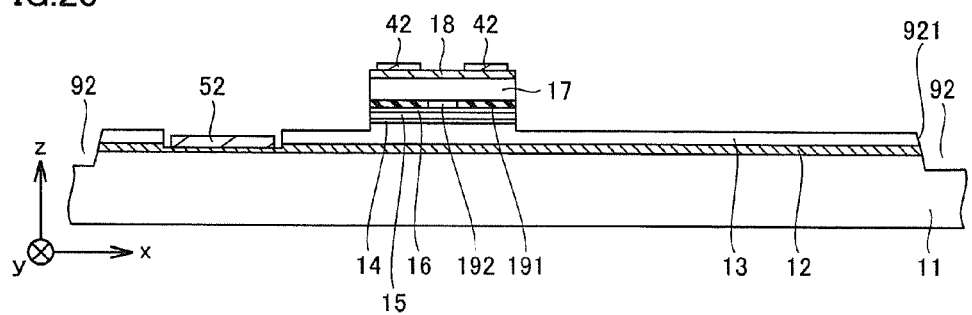
FIG. 23 is a schematic step diagram illustrating an insulating groove formation step in the method of manufacturing a vertical cavity surface emitting laser array according to any of the first to sixth embodiments of the present disclosure.

Referring to FIG. 23, the insulating grooves 92 are formed between the VCSEL element 1 and the VCSEL element 2, and between the VCSEL element 2 and the VCSEL element 3 (refer to FIG. 2 for both). In addition, the insulating groove 91 is formed between the VCSEL element column 101 and the VCSEL element column 102 (refer to FIG. 1A for both) (step S107).

Figure 24:
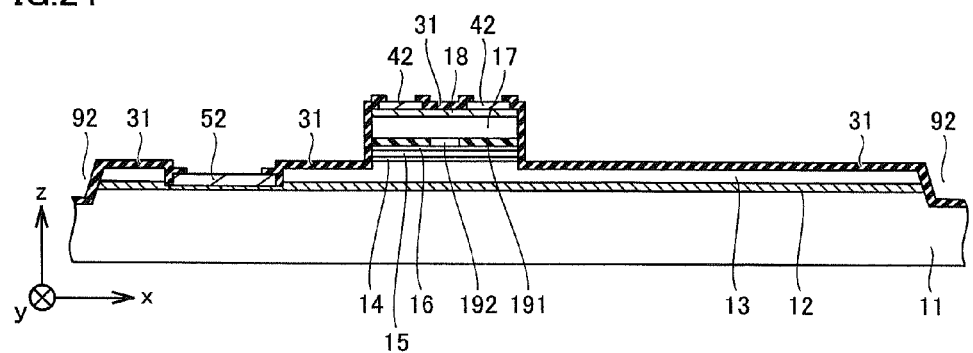
FIG. 24 is a schematic step diagram illustrating an insulating protective film formation step in the method of manufacturing a vertical cavity surface emitting laser array according to any of the first to sixth embodiments of the present disclosure.

Referring to FIG. 24, the insulating protective film 31 is formed on the surface of each of the structures formed in the above-described steps except for the anode ohmic electrode 42 and the cathode ohmic electrode 52 (step S108). More specifically, SiN can be deposited by using chemical vapor deposition (CVD) for example.

If the insulating protective film 31 is not formed, there is a possibility that a very small leakage current (refer to FIG. 5) will flow along the exposed surfaces of the insulating grooves 91 and 92. By carrying out a passivation treatment (treatment of step S108), a leakage current that flows along the surfaces of the insulating grooves 91 can be suppressed and therefore the isolation between VCSEL elements that are adjacent to each other with the insulating grooves 91 and 92 therebetween can be strengthened even more.

It is preferable that the cross-sectional shape of the insulating grooves 92 be a normal tapered shape. In other words, it is preferable that the cross-sectional area of the insulating grooves 92 become smaller in a direction from the front surface side toward the rear surface side of the base substrate 11 (negative z direction in FIG. 4). In this way, the coverage of the insulating protective film 31 on side walls 921 of the insulating grooves 92 can be improved. Although the description will not be repeated, the same is true for the insulating grooves 91.

Figure 25:
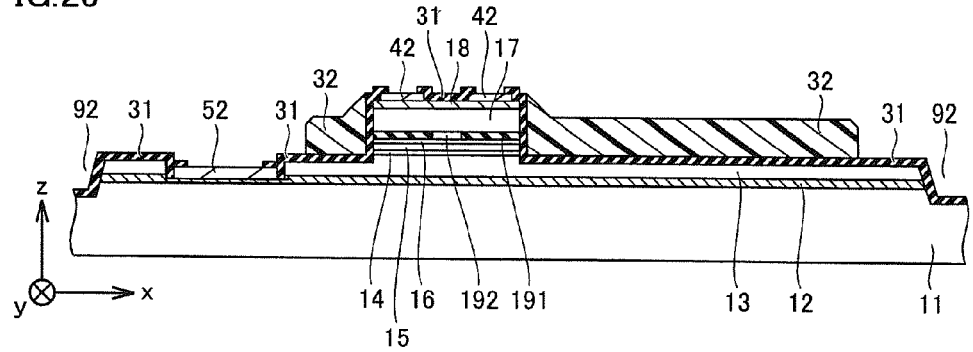
FIG. 25 is a schematic step diagram illustrating an insulating layer formation step in the method of manufacturing a vertical cavity surface emitting laser array according to any of the first to sixth embodiments of the present disclosure.

Referring to FIG. 25, the insulating layer 32 is formed in a region that is on the insulating protective film 31 and is close to the mesa structure 81 (step S109). In order to form the insulating layer 32, for example polyimide, which is a photosensitive resin, can be applied to the insulating protective film 31 by using spin coating. After that, photolithography and curing are performed.

Figure 26:
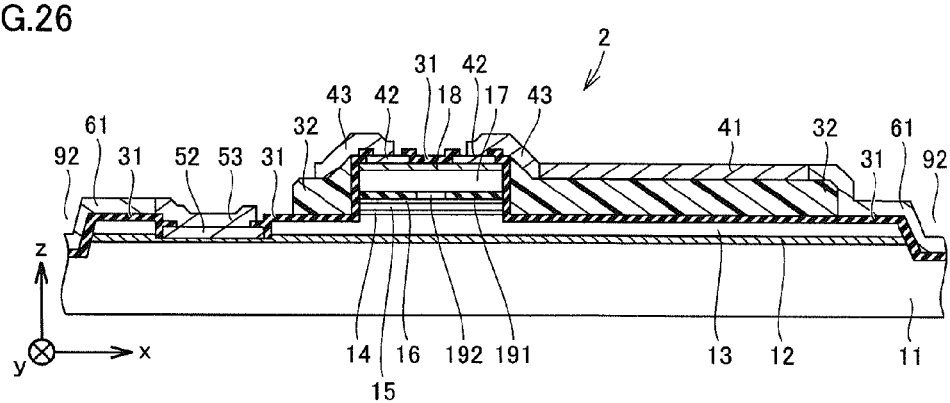
FIG. 26 is a schematic step diagram illustrating an electrode pad and routing wiring formation step in the method of manufacturing a vertical cavity surface emitting laser array according to any of the first to sixth embodiments of the present disclosure.

Referring to FIG. 26, electrode pads and routing wiring lines for wire bonding (anode routing wiring line 43 and cathode routing wiring lines 53, refer to FIG. 2 for both) are formed (step S110). In addition, in this embodiment, in order to reduce the workload, the series wiring lines 61 and the parallel wiring lines 73 and 74 are formed together with the electrode pads and routing wiring lines.

In order to secure coverage on the side walls 921 of the insulating grooves 92, it is preferable that the series wiring lines 61 be formed using sputtering deposition, plating or a combination of these techniques. For example, titanium (Ti) and gold (Au) can be used as the material of the series wiring lines 61.

Next, a burn-in test is carried out by supplying a load current I from the external current source 64 (refer to FIG. 5). Tests other than the burn-in test may be carried out as needed (step S111).

Figure 27:
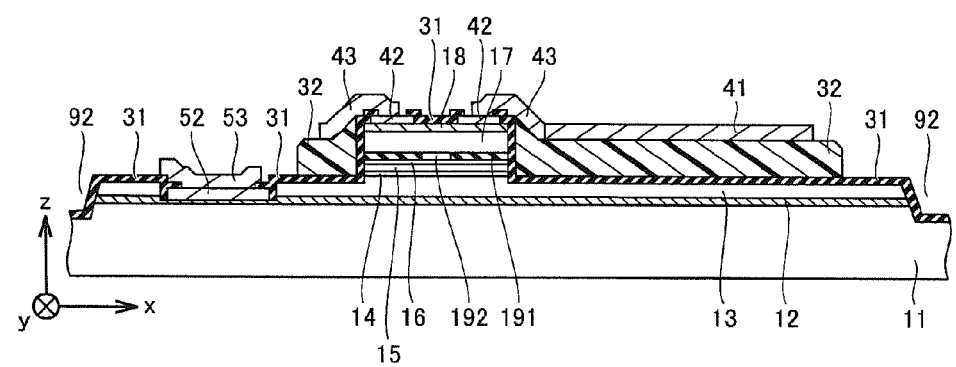
FIG. 27 is a schematic step diagram illustrating a step of removing wiring between elements in the method of manufacturing a vertical cavity surface emitting laser array according to any of the first to sixth embodiments of the present disclosure.

Referring to FIG. 27, after the tests are finished, the series wiring lines 61 and the parallel wiring lines 73 and 74 are removed by photolithography and etching (step S112). At the time of etching, it is preferable that only the series wiring lines 61 and the parallel wiring lines 73 and 74 be removed without affecting the insulating protective film 31. As an example, a potassium iodide (KI) solution and a fluoro-nitric acid (HF+HNO3) solution selectively remove parts formed of Au and parts formed of Ti respectively of the series wiring lines and the parallel wiring lines 73 and 74. Therefore, by forming the insulating protective film 31 using SiN, it is possible to remove only the series wiring lines 61 and the parallel wiring lines 73 and 74 without affecting the insulating protective film 31.

Finally, the VCSEL array 901 is divided into individual VCSEL elements by being cut with a dicing machine for example (step S113). In order to make efficient use of the area of the wafer on which the VCSEL array 901 is formed (that is, the area of the base substrate 11), the regions to be cut with the dicing machine can also serve as the regions in which the insulating grooves 91 and 92 are formed. At this time, it is preferable that the insulating protective film 31 formed on the insulating grooves 91 and 92 be removed. The insulating protective film 31 can be removed by performing photolithography and then performing etching for example. In this way, wearing down of the blade of the dicing machine can be suppressed, and the impact of the dicing machine transmitted to the VCSEL elements can be softened. Once the processing of step S113 is complete, the series of processing steps is complete.

The wafer may be divided into individual VCSEL elements by being cut using a dicing machine (step S113) in a state where the processing for removing the series wiring lines 61 and the parallel wiring lines 73 and 74 (processing of step S112) has not been performed and the series wiring lines 61 and the parallel wiring lines 73 and 74 remain. Thus, traces of the series wiring lines 61 and the parallel wiring lines 73 and 74 cut by the dicing machine can be confirmed in the individual VCSEL elements. For example, parts of the wiring lines 61 between the elements illustrated in FIG. 2 remain in the individual VCSEL elements.

In addition, before the processing of dividing the wafer into individual VCSEL elements (processing of step S113), a sticker, tape or the like can be stuck to the entire back surface of the wafer. Despite the wafer being cut with the dicing machine, the sticker or the tape will remain on the rear surface of the wafer without being cut. Thus, the VCSEL elements obtained by the wafer being divided into individual elements can be collectively handled in a state in which they are arranged in an array pattern. Therefore, it is easy to handle the VCSEL elements when for example shipping, transporting or mounting the VCSEL elements.

Modification 1 of First to Sixth Embodiments

In the first to sixth embodiments, a case is described in which the VCSEL array is provided with insulating grooves. However, a structure for electrically insulating the VCSEL elements from one another is not limited to this structure.

Figure 28:
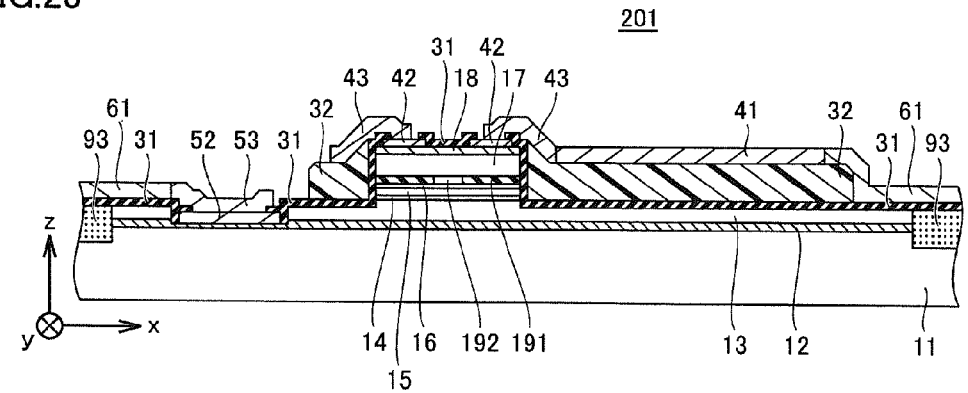
FIG. 28 is an enlarged view of a cross section of a column of vertical cavity surface emitting laser elements having a different structure to the column of vertical cavity surface emitting laser elements illustrated in FIG. 3.

FIG. 28 is an enlarged view of the cross section of a VCSEL element column having a different structure to the VCSEL element column 101 illustrated in FIG. 3. Referring to FIG. 28, a VCSEL element column 201 differs from the VCSEL element column 101 in that high-resistance regions 93 are provided instead of the insulating grooves 91 and 92. The high-resistance regions 93 correspond to an "insulating region" in the present disclosure.

The high-resistance regions 93 are formed using ion implantation. Thus, the electrical resistivity of the high-resistance regions 93 is higher than the electrical resistivity of the base substrate 11 (for example, $1.0 \times 10^7$ Ω·cm or higher). The structures of other parts of the VCSEL element column 201 are the same as the structures of the corresponding parts of the VCSEL element column 101 and therefore a detailed description thereof will not be repeated. The high-resistance regions also have the characteristics of the dummy pads or the wiring line portions of the parallel wiring lines described in the first to sixth embodiments, and therefore the same effect as in the first to sixth embodiments can be obtained.

Modification 2 of First to Sixth Embodiments

In the first to sixth embodiments, a semi-insulating semiconductor substrate is used as the base substrate. However, the type of base substrate is not limited to a semi-insulating semiconductor substrate. A conductive or semi-conductive semiconductor substrate can also be used as the base substrate.

Figure 29:
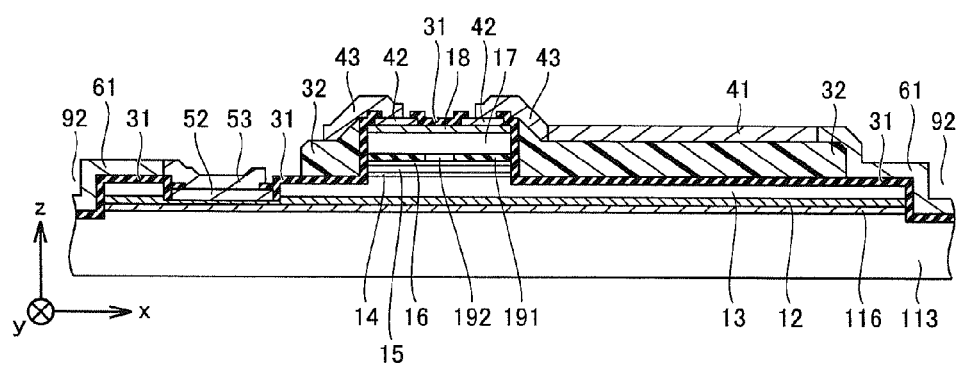
FIG. 29 is an enlarged view of a cross section of a column of vertical cavity surface emitting laser elements having a further different structure to the column of vertical cavity surface emitting laser elements illustrated in FIG. 3.

FIG. 29 is an enlarged view of the cross section of a VCSEL element column having a further different structure to the VCSEL element column 101 illustrated in FIG. 3. Referring to FIG. 29, a VCSEL element column 202 differs from the VCSEL element column 101 in that a conductive or semi-conductive base substrate 113 is provided instead of the semi-insulating base substrate 11 and in that a p-type-conductivity semiconductor layer 116 is provided between the base substrate 113 and the n-type contact layer 12.

The p-type-conductivity semiconductor layer 116 and the n-type contact layer 12 form a pn junction. The forward direction of the pn junction is opposite to the direction of the load current I (negative z direction, refer to FIG. 5). Accordingly, it is difficult for the load current I to reach the base substrate 113. Therefore, it is difficult for a leakage current to flow between the VCSEL elements. The structures of other parts of the VCSEL element column 202 are the same as the structures of the corresponding parts of the VCSEL element column 101 and therefore a detailed description thereof will not be repeated.

Modification 1 and modification 2 of the first to sixth embodiments may be combined. That is, the high-resistance regions 93 (refer to FIG. 28) can also be formed in the structure in which the p-type-conductivity semiconductor layer 116 is formed on the conductive or semi-conductive base substrate 113.

In the first to sixth embodiments, an AlGaAs-based semiconductor material has been described. However, a semiconductor material that can be used in the present disclosure is not limited to this semiconductor material, and other materials such as a GaInP-based, a ZnSSe-based, an InGaN-based, an AlGaN-based, an InGaAs-based, a GaInNAs-based or a GaAsSb-based semiconductor material can also be used in accordance with the emission wavelength.

The presently disclosed embodiments are illustrative in all points and should not be thought of as being limiting. The scope of the present disclosure is defined by the scope of the claims and it is intended that equivalents to the scope of the claims and all modifications within the scope of the claims be included within the scope of the present disclosure.

The invention claimed is:

1. A vertical cavity surface emitting laser array comprising:
a semiconductor substrate;
a plurality of vertical cavity surface emitting laser element columns arranged in a row direction on a front-surface side of the semiconductor substrate; and
parallel wiring lines that connect the plurality of vertical cavity surface emitting laser element columns in parallel with each other;
wherein the plurality of vertical cavity surface emitting laser element columns each include
a plurality of vertical cavity surface emitting laser elements arranged in a column direction, and
a plurality of series wiring lines that serially connect every two of the vertical cavity surface emitting laser elements that are adjacent to each other in the column direction among the plurality of vertical cavity surface emitting laser elements in such an orientation that forward directions of the two vertical cavity surface emitting laser elements match, and
a first insulating region that electrically insulates the plurality of vertical cavity surface emitting laser element columns from each other and a second insulating region that electrically insulates the plurality of vertical cavity surface emitting laser elements from each other are formed in the semiconductor substrate.

2. The vertical cavity surface emitting laser array according to claim 1, further comprising:
at least one pair of dummy pads that are electrically connected to the parallel wiring lines in order to supply a load current from burn-in test probes to the plurality of vertical cavity surface emitting laser element columns.

3. The vertical cavity surface emitting laser array according to claim 2,
wherein the plurality of vertical cavity surface emitting laser elements are arranged inside a quadrangular region on the front-surface side of the semiconductor substrate, and
the pair of dummy pads are arranged near a first corner and a second corner positioned on a diagonal line among first to fourth corners corresponding to the four corners of the quadrangular region.

4. The vertical cavity surface emitting laser array according to claim 3,
wherein the parallel wiring lines each include a plurality of wiring line portions that each connect in parallel two vertical cavity surface emitting laser element columns that are adjacent to each other in the row direction, and a resistance value of each of the plurality of wiring line portions is set so as to be inversely proportional to a value of the load current that will flow through the wiring line portion in a state where the load current is supplied to the plurality of vertical cavity surface emitting laser element columns.

5. The vertical cavity surface emitting laser array according to claim 4,
wherein each of the plurality of wiring line portions is configured so as to have a wiring line width that corresponds to a value of the load current that will flow through the wiring line portion in a state where the load current is supplied to the plurality of vertical cavity surface emitting laser element columns.

6. The vertical cavity surface emitting laser array according to claim 2,
wherein the plurality of vertical cavity surface emitting laser element columns includes
a first vertical cavity surface emitting laser element column including m vertical cavity surface emitting laser elements, where m is a natural number of 2 or more, and
a second vertical cavity surface emitting laser element column including n vertical cavity surface emitting laser elements, where n is a natural number that is smaller than m, and
at least one of the pair of dummy pads is arranged in a region corresponding to the area of m−n vertical cavity surface emitting laser elements in the vicinity of the second vertical cavity surface emitting laser element column on the front-surface side of the semiconductor substrate.

7. The vertical cavity surface emitting laser array according to claim 6,
wherein the second vertical cavity surface emitting laser element column further includes a dummy element that causes a voltage drop to be generated that corresponds to the size of a voltage drop that would be caused by the m−n vertical cavity surface emitting laser elements.

8. The vertical cavity surface emitting laser array according to claim 1,
wherein the plurality of vertical cavity surface emitting laser elements each has
an anode electrode and a cathode electrode,
an anode electrode pad electrically connected to the anode electrode, and
a cathode electrode pad electrically connected to the cathode electrode,
the parallel wiring lines each include
a plurality of wiring line portions that each connect in parallel two vertical cavity surface emitting laser element columns that are adjacent to each other in the row direction, and
the plurality of wiring line portions are each arranged between one cathode electrode pad and another cathode electrode pad of two vertical cavity surface emitting laser elements that are adjacent to each other in the row direction.

9. The vertical cavity surface emitting laser array according to claim 1,
wherein the semiconductor substrate has a semi-insulating property,
the first and second insulating regions are each an insulating groove having a shape that is recessed from the front-side surface of the semiconductor substrate toward the inside of the semiconductor substrate, and the parallel wiring lines each include a wiring line portion formed on the insulating groove of the second insulating region.

10. The vertical cavity surface emitting laser array according to claim 1,
wherein the semiconductor substrate has a semi-insulating property and the first and second insulating regions are each a high-resistance region that has a higher electrical resistivity than the semiconductor substrate.

* * * * *